United States Patent
Karhade et al.

(10) Patent No.: US 12,334,472 B2
(45) Date of Patent: Jun. 17, 2025

(54) MULTIPLE WAFER STACK ARCHITECTURE TO ENABLE SINGULATION

(71) Applicant: Intel Corporation, Santa Clara, CA (US)

(72) Inventors: Omkar Karhade, Chandler, AZ (US); Sairam Agraharam, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 665 days.

(21) Appl. No.: 17/558,995

(22) Filed: Dec. 22, 2021

(65) Prior Publication Data

US 2023/0197685 A1 Jun. 22, 2023

(51) Int. Cl.
*H01L 23/48* (2006.01)
*H01L 21/78* (2006.01)
(Continued)

(52) U.S. Cl.
CPC .......... *H01L 25/0657* (2013.01); *H01L 21/78* (2013.01); *H01L 24/08* (2013.01);
(Continued)

(58) Field of Classification Search
CPC ..... H01L 25/0657; H01L 21/78; H01L 24/08; H01L 24/80; H01L 2224/08145; H01L 2224/80895; H01L 2224/80896; H01L 2924/15311; H01L 24/16; H01L 2224/32145; H01L 2224/16145; H01L 2225/06568; H01L 2225/06555; H01L 2225/06562; H01L 2224/48145; H01L 2224/24221; H01L 25/074; H01L 23/53295; H01L 2224/1308; H01L 2224/0508; H01L 2224/0558; H01L 2224/24145; H01L 2224/73204; H01L 24/13; H01L 2224/16227; H01L 2224/16146; H01L 2225/06586; H01L 2224/13022; H01L 2224/11334; H01L 2224/85205; H01L 2224/13023; H01L 2224/05008; H01L 2224/13; H01L 2224/81192; H01L 2225/0652; H01L 2224/1134; H01L 2224/73104; H01L 2224/73207; H01L 2224/1191; H01L 2224/13006; H01L 2224/14051;
(Continued)

(56) References Cited

FOREIGN PATENT DOCUMENTS

| CN | 108878398 A | * 11/2018 | ........... H01L 21/304 |
| CN | 112151515 A | * 12/2020 | ........... H01L 21/561 |

* cited by examiner

*Primary Examiner* — Niki H Nguyen
(74) *Attorney, Agent, or Firm* — Essential Patents Group, LLP

(57) ABSTRACT

Microelectronic stacked die package structures formed according to some embodiments may include a first die comprising a first conductive layer over a substrate layer. A second die may be on the first conductive layer. A third die is on the second die. An edge region of the stacked die package structure comprises a first portion over a second portion, the first portion comprising edges of the third die, the second die, and the first conductive layer, and the second portion comprising the substrate layer of the first die, wherein the first portion comprises a curved profile, and the second portion comprises a substantially vertical profile.

20 Claims, 23 Drawing Sheets

(51) Int. Cl.
*H01L 23/00* (2006.01)
*H01L 23/52* (2006.01)
*H01L 25/065* (2023.01)
*H01L 29/40* (2006.01)

(52) U.S. Cl.
CPC .... *H01L 24/80* (2013.01); *H01L 2224/08145* (2013.01); *H01L 2224/80895* (2013.01); *H01L 2224/80896* (2013.01)

(58) Field of Classification Search
CPC ... H01L 2224/1411; H01L 2224/13009; H01L 2224/13021; H01L 2224/16147; H01L 2224/16014; H01L 24/742; H01L 2021/60022; H01L 2224/16151; H01L 2224/1624; H01L 2224/14517; H01L 2224/81194
See application file for complete search history.

MULTIPLE WAFER STACK ARCHITECTURE TO ENABLE SINGULATION

BACKGROUND

In electronics manufacturing, integrated circuit (IC) packaging is a stage of manufacture where an IC that has been fabricated on a die or chip comprising a semiconducting material is coupled to a supporting case or "package" that can protect the IC from physical damage and support electrical interconnect suitable for further connecting to a host component, such as a printed circuit board (PCB). In the IC industry, the process of fabricating a package is often referred to as packaging, or assembly.

Multiple dies can be assembled into a single IC package. In some multi-die packages, die may be stacked upon each other wherein the various stacked die may be interconnected through a package substrate. Such stacked die units may advantageously combine IC die from heterogeneous silicon processes and/or combine small dis-aggregated die from the same silicon process. However, there are many challenges with integrating multiple IC die (including die stacked upon each other) into a package assembly.

In the packaging process, an IC wafer can be divided into individual IC die. Such individualization of a wafer into multiple dies is called singulation. Due to the ever increasing degree of integration of IC devices, IC wafers have become thinner, making the singulation process increasingly difficult.

Multiple die stacks on IC wafers can be difficult to singulate due to the complexity of material layers in a die stack. For example, a mix of silicon and dielectric materials may need to be removed in a die stack. Various process, such as laser or chemical removal processes as well as die sawing or Bosch chemical processes can be employed during a singulation process. Removal of stack material in the streets of the wafer can be difficult and slow using such process. Additionally, dielectric cracking in low-K dielectric layers can occur.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
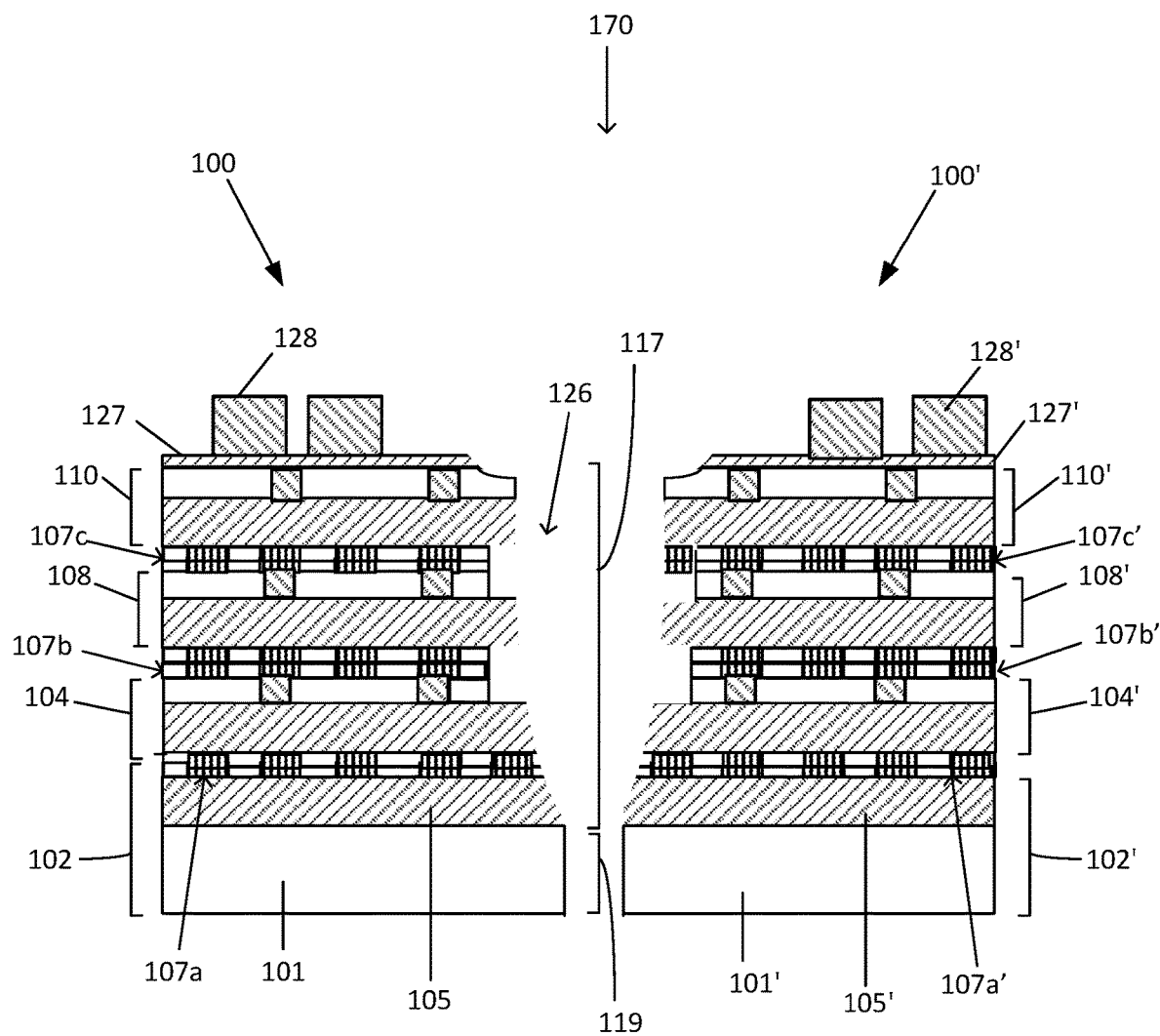
FIGS. 1A-1C are cross-sectional views of a multi-chip stack assembly comprising a moisture seal coating, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the explicit context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

The term "dielectric" generally refers to any number of non-electrically conductive materials that make up the structure of a package substrate. Dielectric material may be incorporated into an integrated circuit package as layers of laminate film or as a resin molded over integrated circuit dice mounted on the substrate, and may comprise dielectric materials used within devices/die and coupled thereto.

The term "metallization" generally refers to metal layers formed over and through the dielectric material of the package substrate and may additionally comprise dielectric materials used within devices/die and coupled thereto). The metal layers are generally patterned to form metal structures such as traces and bond pads. The metallization of a package substrate may be confined to a single layer or in multiple layers separated by layers of dielectric.

The term "bond pad" generally refers to metallization structures that terminate integrated traces and vias in integrated circuit packages and dies. The term "solder pad" may be occasionally substituted for "bond pad" and carries the same meaning.

The term "solder bump" generally refers to a solder layer formed on a bond pad. The solder layer typically has a round shape, hence the term "solder bump".

The term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of forming stacked IC wafer architectures to enable wafer singulation are described herein. Microelectronic stacked die package structures formed according to some embodiments may include a first die comprising a first conductive layer over a substrate layer. A second die may be on the first conductive layer. A third die is on the second die. An edge region of the stacked die package structure comprises a first portion over a second portion, the first portion comprising edges of the third die, the second die, and the first conductive layer, and the second portion comprising the substrate layer of the first die, wherein the first portion comprises a curved profile, and the second portion comprises a substantially vertical profile. Embodiments of the present disclosure enable increased singulation throughput while utilizing known chemistries and/or processes such as laser scribe and saw/plasma etch processes, as are known to those skilled in the art.

The stacked die package structures described herein may be assembled and/or fabricated with one or more of the features or attributes provided in accordance with various embodiments. A number of different assembly and/or fabrication methods may be practiced to generate a stacked die package structure having one or more of the features or attributes described herein.

FIG. 1A is a cross-sectional view of portions of stacked die package structure 100 (and analogously stacked die package structure 100') formed according to some embodiments herein. Accordingly, stacked die portion 100 will be described and it will be understood by those skilled in the art that stacked die structure 100' comprises analogous structures. A first die 102 may comprise a base die/substrate to which any number of additional dies may be placed upon, in some embodiments. The first die 102 may comprise any integrated circuitry fabricated according to any microelectronic technology such as complementary metal oxide semiconductor (CMOS), SiGe, III-V or III-N HEMTs, etc.).

The first die 102 may comprise a bulk silicon region 101 and an active region 105, wherein the active region 105 may comprise circuitry structures including metal routing layers within dielectric layers. The first die 102 may be any appropriate die/device, including, but not limited to, a microprocessor, a chipset, a graphics device, a wireless device, a memory device, an application specific integrated circuit, a transceiver device, an input/output device, combinations thereof, stacks thereof, or the like.

A second die 104 may be on the first die 102. The second die 104 may be any appropriate die/device, including, but not limited to, a microprocessor, a chipset, a graphics device, a wireless device, a memory device, an application specific integrated circuit, a transceiver device, an input/output device, combinations thereof, stacks thereof, or the like. A first hybrid bond layer 107a may be between the first die 102 and the second die 104. The first hybrid bond layer 107a may comprise an insulator-insulator bonded region between dielectric material of the first and second die 102, 104 and metal-metal bonded region between conductive structures of the first and second die 102, 104. In the hybrid bond, oxide portions are bonded together with Vander Wal forces, while metal to metal bonds are formed by temperature processing to be further described herein. In some embodiments the first hybrid bond layer 107a may comprise a first conductive layer.

A third die 108 may be on the second die 104. The third die 108 may be any appropriate die/device, including, but not limited to, a microprocessor, a chipset, a graphics device, a wireless device, a memory device, an application specific integrated circuit, a transceiver device, an input/output device, combinations thereof, stacks thereof, or the like. A second hybrid bond layer 107b may be between the second die 104 and a third die 108. The second hybrid bond layer 107b may comprise oxide portions of the second and third dies 104, 108 that are bonded together with Vander Wal forces, while conductive structures between the second and third dies 104, 108 comprise metal to metal bonds that are formed by temperature processing to be further described herein. In some embodiments the second hybrid bond layer 107b may comprise a second conductive layer.

A fourth die 110 may be on the third die 108. The fourth die 110 may be any appropriate die/device, including, but not limited to, a microprocessor, a chipset, a graphics device, a wireless device, a memory device, an application specific integrated circuit, a transceiver device, an input/output device, combinations thereof, stacks thereof, or the like. A third hybrid bond layer 107c may be between the fourth die 110 and the third die 108. The third hybrid bond layer 107c may comprise oxide portions of the second and third dies 104, 108 that are bonded together with Vander Wal forces, while conductive structures between the third and fourth dies 108, 110 comprise metal to metal bonds that are formed by temperature processing to be further described herein. In some embodiments the third hybrid bond layer 107c may comprise a third conductive layer.

A redistribution layer (RDL) 127 may be on a surface of the fourth die 110. In some embodiments, the RDL 127 may comprise one or more levels of metallization which may redistribute conductive interconnect structures within the various dies 102, 104, 108, 110 to a larger pitch that may be associated with conductive pads 128 on a surface of the RDL 127. Stacked die package structure 100' may comprise analogous structures as the stacked die package structure 100' and may be essentially a mirror image structure 100' to the stacked die package structure 100. Stacked die package structures 100, 100' may be formed by employing a singulation process or singulation processes (including singulation process 170, for example) to be described in more detail subsequently herein. In some embodiments, any number of die may be stacked upon each other to form stacked die package structures 100, 100'.

Figure 1B:
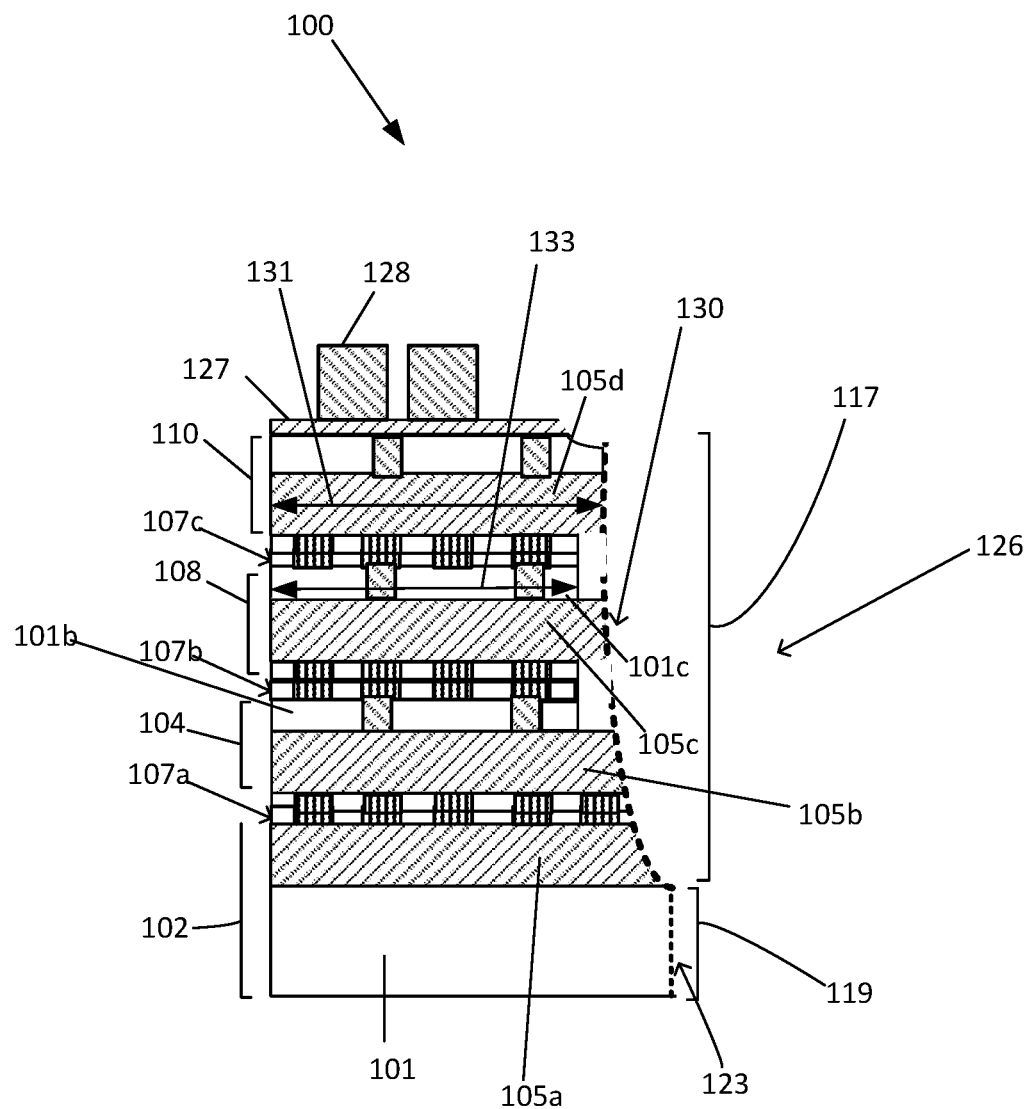

Following a singulation process, the formation of the individual stacked die package structures 100, 100', results in the formation of an edge region 126 of the stacked die package structures 100, 100'. The edge region 126 comprises a first portion 117 comprising a substantially curved profile, and a second portion 119 comprising a vertical profile 119. FIG. 1B depicts the edge region 126 of the stacked die package structure 100 in more detail.

In FIG. 1B, the edge region 126 comprises a first portion 117 wherein the first portion comprises edges of the fourth die 110, the third die 108, the second die 104 and the active region 105 of the first die 102, as well as edges of the hybrid bond layers 107a, 107b, 107c, in some embodiments. In some embodiments, the first portion 117 may comprise edge regions of any number of die stacked upon each other in the stacked die package structures 100, 100'. The second portion 119 comprises an edge of the bulk silicon layer 101, which may comprise a substrate layer 101 of the first die 102 in some embodiments. The first portion 117 comprises a substantially curved profile 130, as shown as a dotted line in FIG. 1B. In some embodiments, and the second portion 119 comprises a substantially vertical profile 123.

In some embodiments, the substantially curved profile 130 may comprise a substantially concave curvature profile, and may comprise a jagged first portion 117, wherein an active region 105d of the fourth die 110 may comprise a greater lateral width 131 than a lateral width 133 of the bulk silicon layer 101c of the third die 108, for example due to differences in removal rates of the active region 105d material(s) and the bulk silicon layer 101c material during a removal process which may comprise a laser scribe process, for example. In some embodiments the bulk silicon layers of the die in the stacked die package structures 100, 100' may comprise lateral widths that are less than the lateral widths of the active regions of the die in the stacked die package structures 100, 100'.

The second portion 119 may comprise bulk undoped silicon in some embodiments. The second portion 119 of the edge region 126 may comprise a vertical profile 123 through the bulk silicon layer 101a. The substantially vertical profile 123 may arise from a sawing process through the bulk silicon layer 101, as will be described subsequently herein.

Figure 1C:
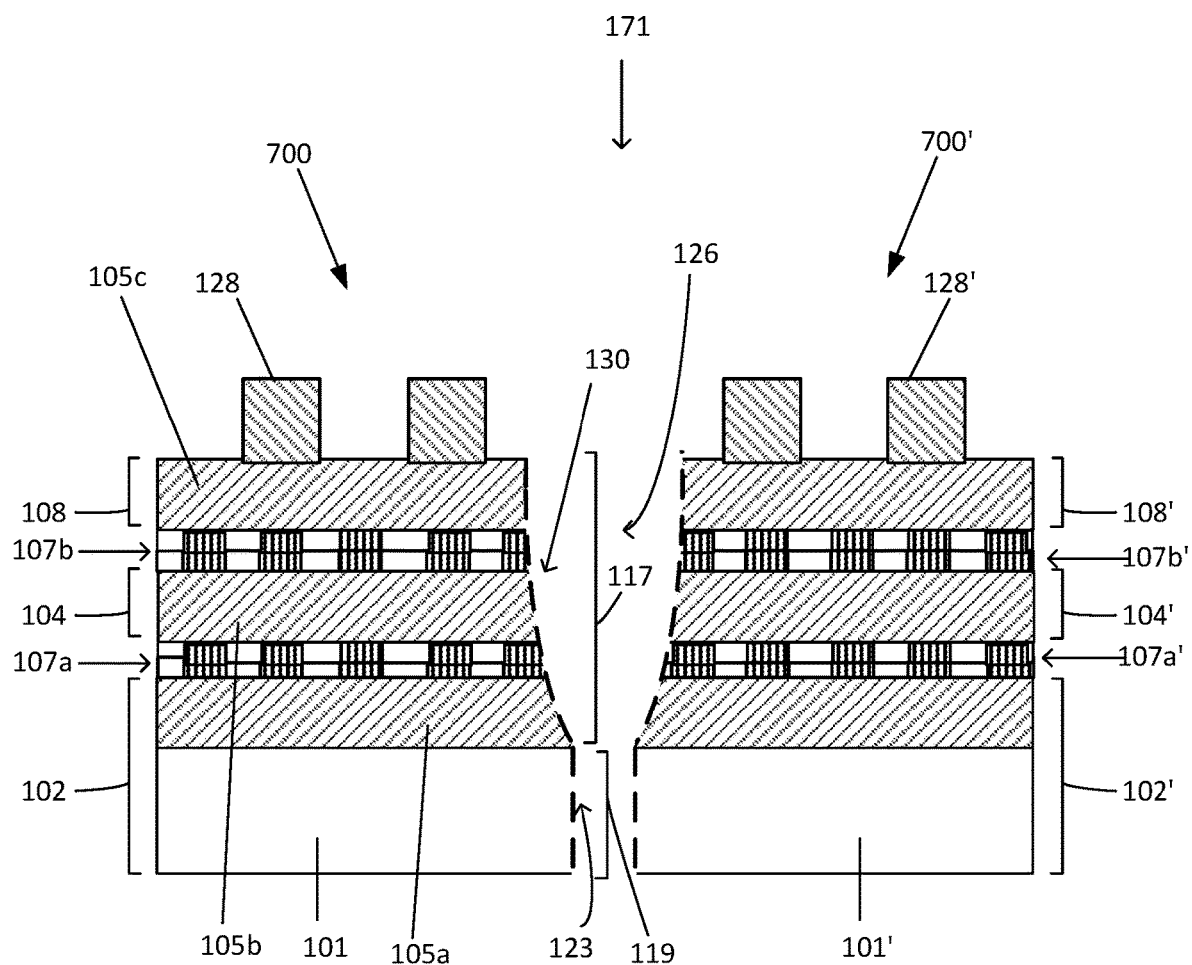

FIG. 1C depicts a cross-sectional view of portions of stacked die package structures 700 (and analogously stacked die package structure 700') formed according to some embodiments herein. Stacked die package structure 700' may comprise analogous structures as the stacked die package structure 700 and may be essentially a mirror image structure 700' to the stacked die package structure 700. Stacked die package structures 700, 700' may be formed by employing a singulation process or singulation processes (including singulation process 701, for example) to be described in more detail subsequently herein. Accordingly, stacked die portion 700 will be described and it will be understood by those skilled in the art that stacked die structure 700' comprises analogous structures.

Stacked die portion 700 may comprises a first die 102 which may comprise a base die/substrate to which any number of additional dies may be placed upon, in some embodiments. The first die 102 may comprise any integrated circuitry fabricated according to any microelectronic technology such as complementary metal oxide semiconductor (CMOS), SiGe, III-V or III-N HEMTs, etc.).

The first die 102 may comprise a bulk silicon region 101 and an active region 105a, wherein the active region 105a may comprise circuitry structures including metal routing conductive layers within dielectric layers. The first die 102 may be any appropriate die/device, including, but not limited to, a microprocessor, a chipset, a graphics device, a wireless device, a memory device, an application specific integrated circuit, a transceiver device, an input/output device, combinations thereof, stacks thereof, or the like.

A second die 104 may be on the first die 102 of the stacked die package structure 700. The second die 104 may comprise an active region 105b but may not comprise a bulk silicon region. The active region 105b may comprise circuitry structures including metal routing layers within dielectric layers. The second die 104 may be any appropriate die/device, including, but not limited to, a microprocessor, a chipset, a graphics device, a wireless device, a memory device, an application specific integrated circuit, a transceiver device, an input/output device, combinations thereof, stacks thereof, or the like. A first hybrid bond layer 107a may be between the active region 105a of the first die 102 and the active region 105b of the second die 104. The hybrid bond layer 107a may be directly on the active region 105a and may be directly on the active region 105b in some embodiments.

An active region 105c of a third die 108 may be over the active region 105b of the second die 104. The third die 108 may comprise the active region 105c but may not comprise a bulk silicon region. The third die 108 may be any appropriate die/device, including, but not limited to, a microprocessor, a chipset, a graphics device, a wireless device, a memory device, an application specific integrated circuit, a transceiver device, an input/output device, combinations thereof, stacks thereof, or the like. A second hybrid bond layer 107b may be between the second die 104 and a third die 108.

The second hybrid bond layer 107b may comprise oxide portions of the second and third dies 104, 108 that are bonded together with Vander Wal forces, while conductive structures between the second and third dies 104, 108 comprise metal to metal bonds that are formed by temperature processing to be further described herein. The second hybrid bond layer 107b may be directly on the active region 105b of the second die 104 and may be directly on the active region 105c of the third die 108. Conductive pads 128 may be on a top surface of the third die 108.

Following a singulation process, such as singulation process 171, for example, the formation of the individual stacked die package structures 700, 700', results in the formation of an edge region 126 of the stacked die package structures 700, 700'. The edge region 126 comprises a first portion 117 comprising a substantially curved profile, and a second portion 119 comprising a vertical profile 119. The first portion 117 comprises edges of the third die 108, the second die 104, and the active region 105a of the first die 102, as well as edges of the first and second hybrid bond layers 107a, 107b. The second portion 119 comprises the edge of the bulk silicon layer 101 of the first die 102, which may comprise an edge of the substrate layer 101 of the first die 102 in some embodiments.

The first portion 117 comprises a substantially curved profile 130, as shown as a dotted line in FIG. 1C. The second portion 119 comprises a substantially vertical profile 123. In some embodiments, the substantially curved profile 130 may comprise a substantially concave curvature profile and may comprise a smooth first portion 117. The second portion 119 may comprise bulk undoped silicon in some embodiments. The second portion 119 of the edge region 126 may comprise a vertical profile 123 through the bulk silicon layer 101 of the first die 102. The substantially vertical profile 123 may arise from a sawing process through the bulk silicon layer 101, in some embodiments.

Figure 2A:
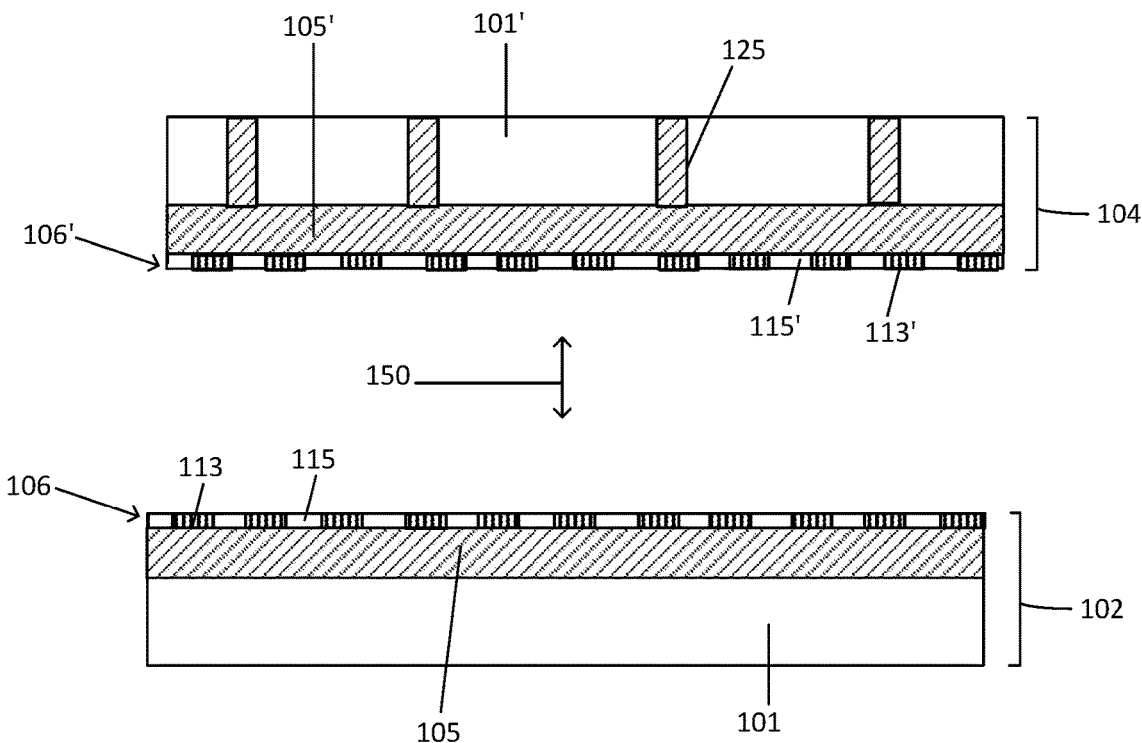
FIGS. 2A-2N illustrate cross-sectional views of forming stacked die assemblies comprising a moisture seal coating, in accordance with some embodiments.
Figure 2B:
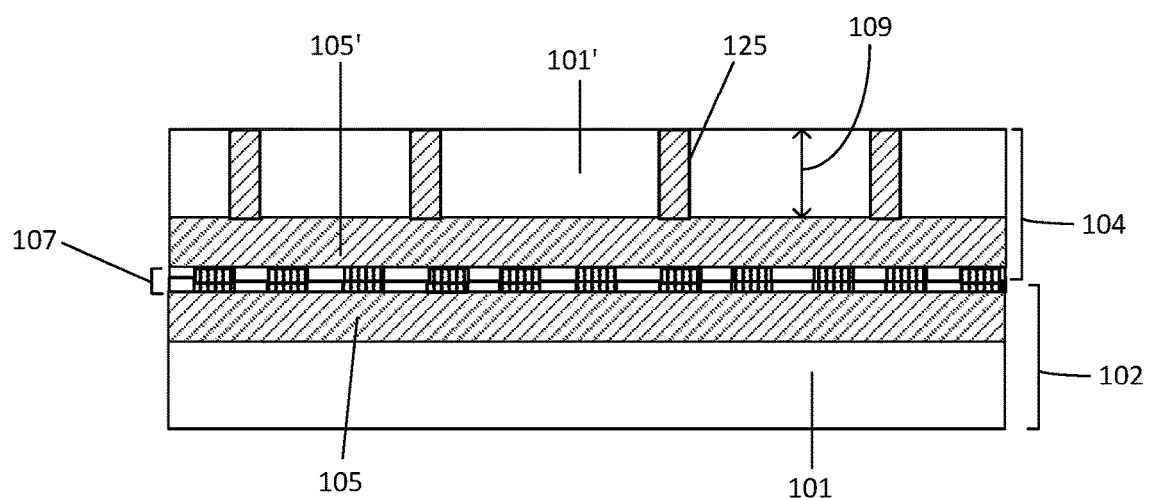
Figure 2C:
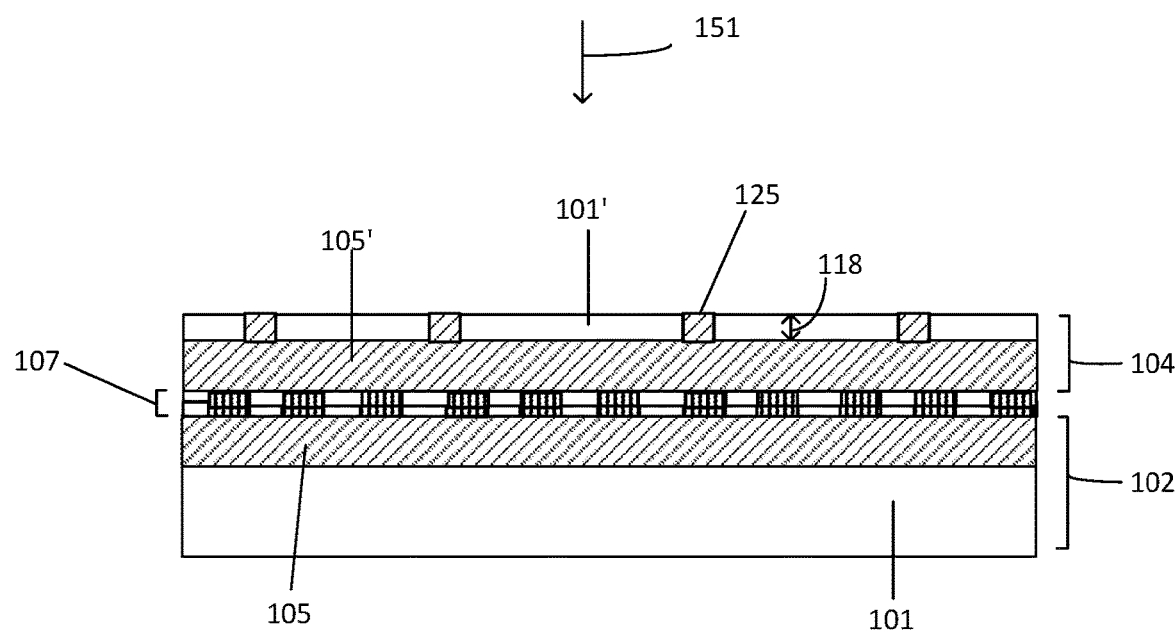
Figure 2D:
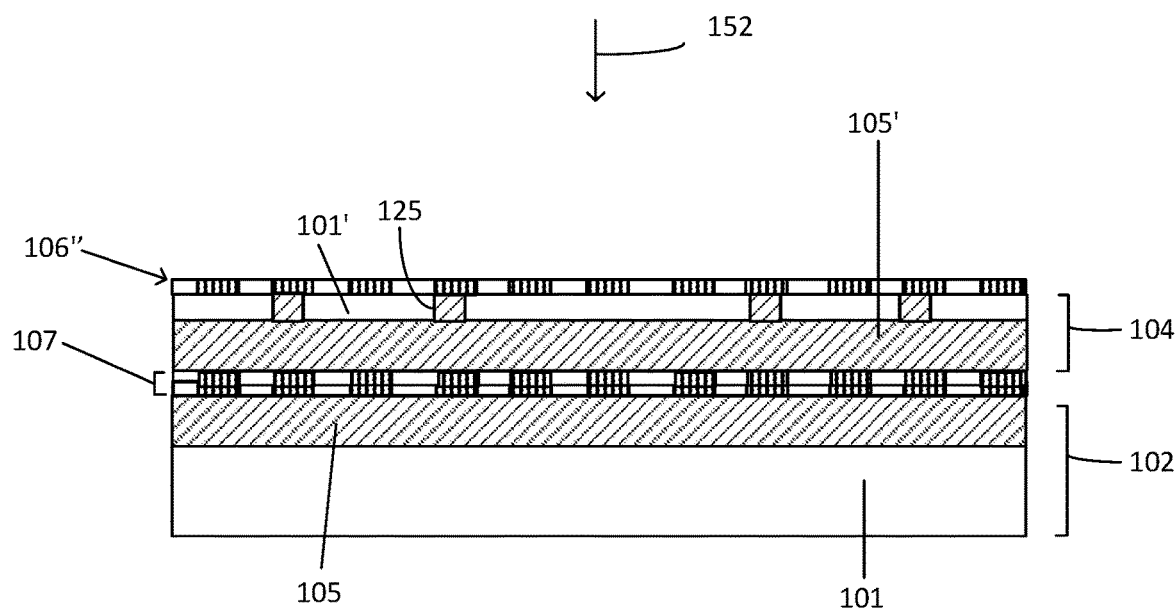
Figure 2E:
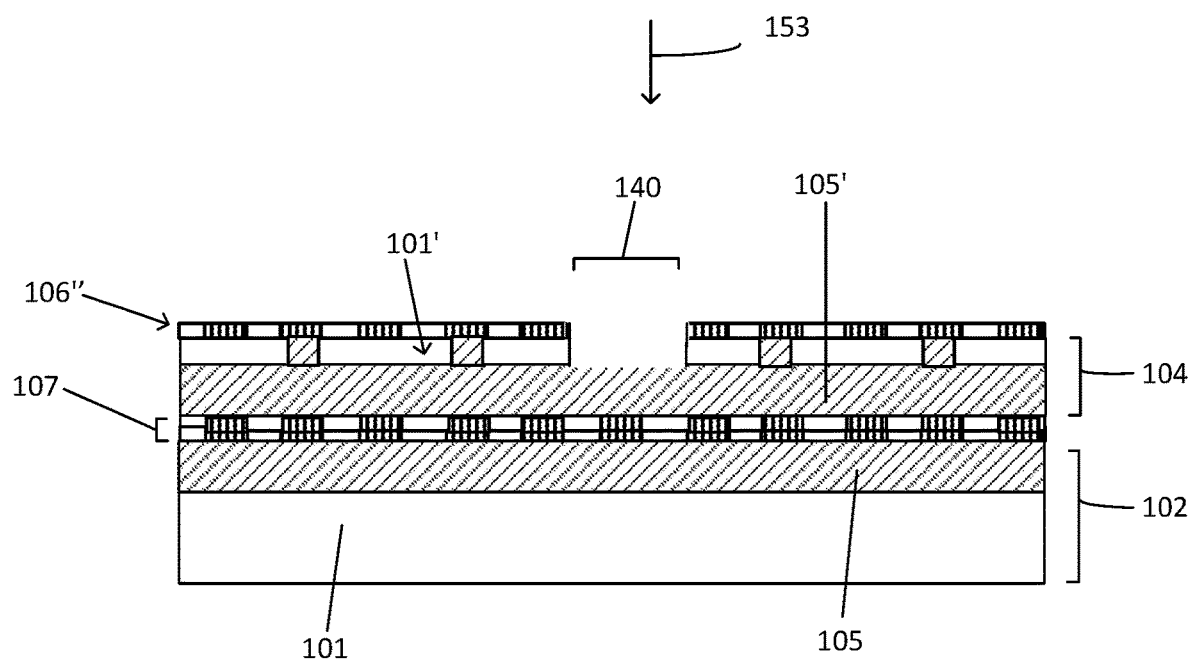
Figure 2F:
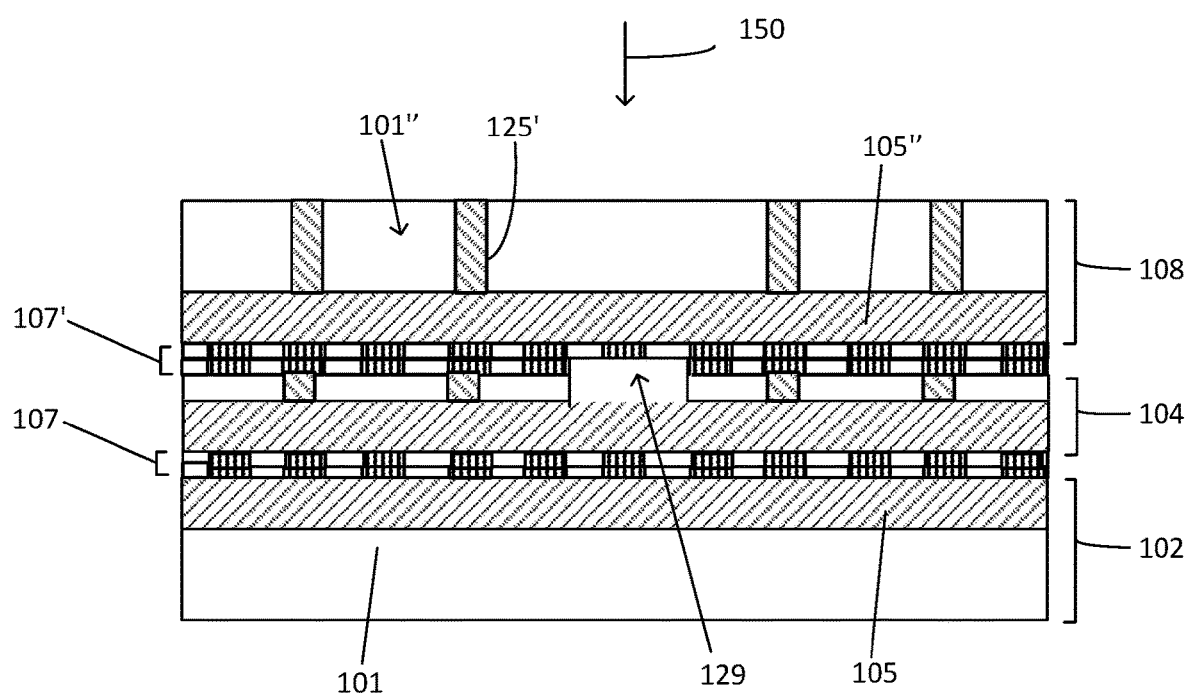
Figure 2G:
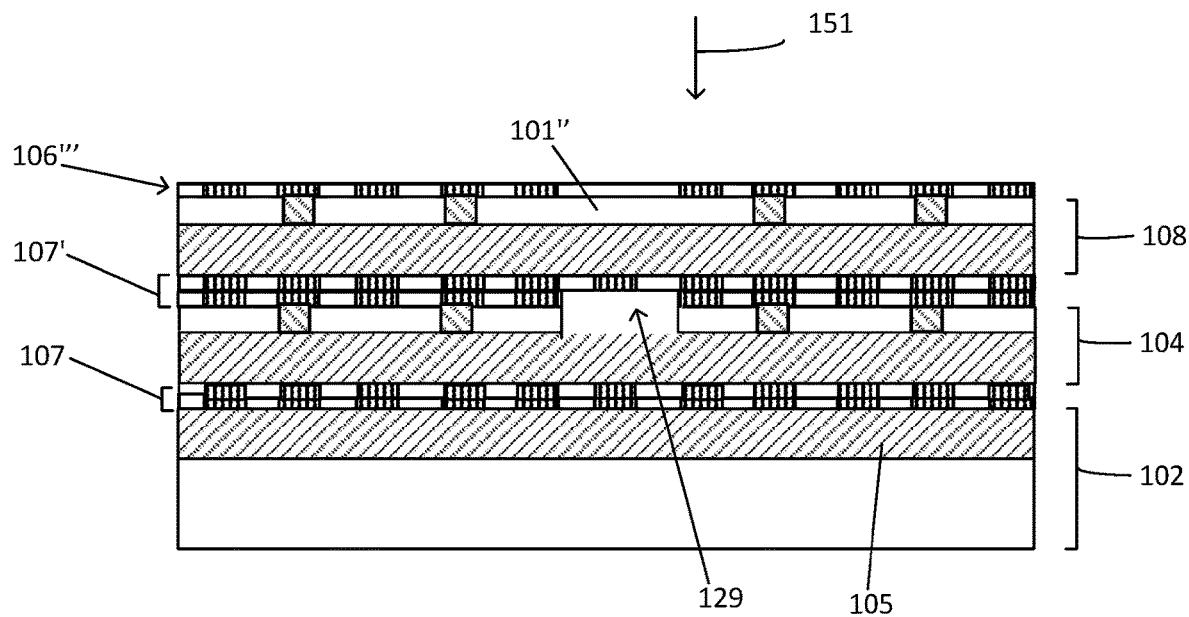
Figure 2H:
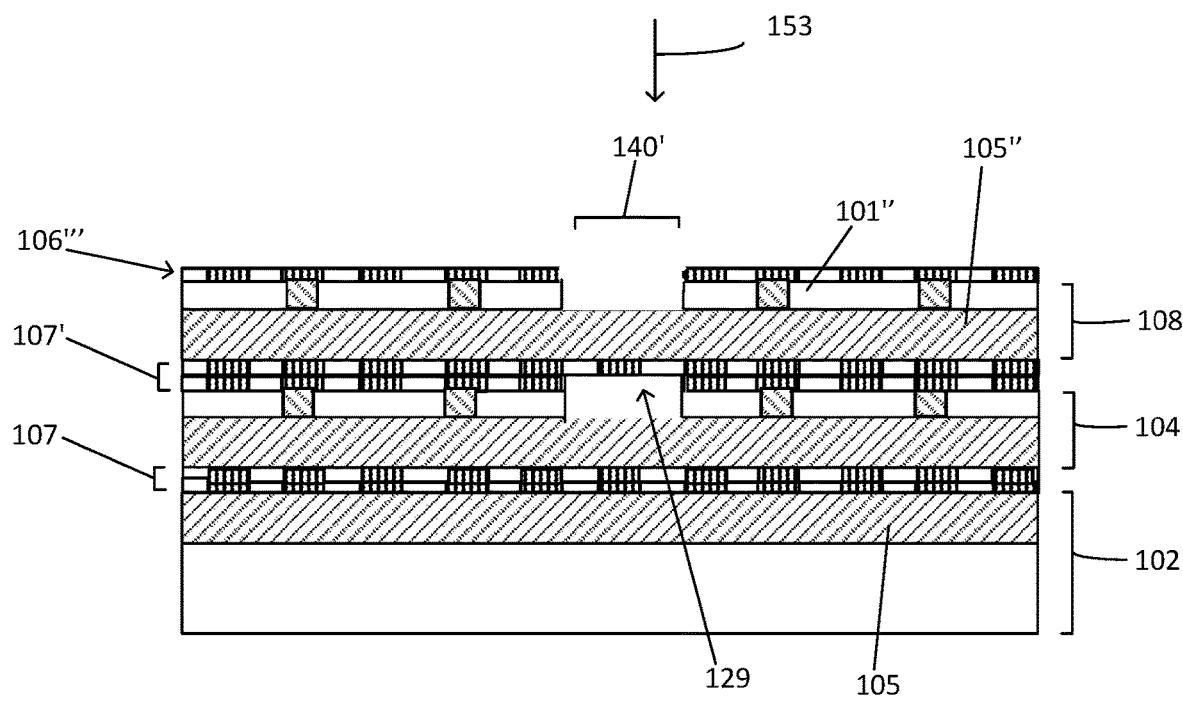
Figure 21:
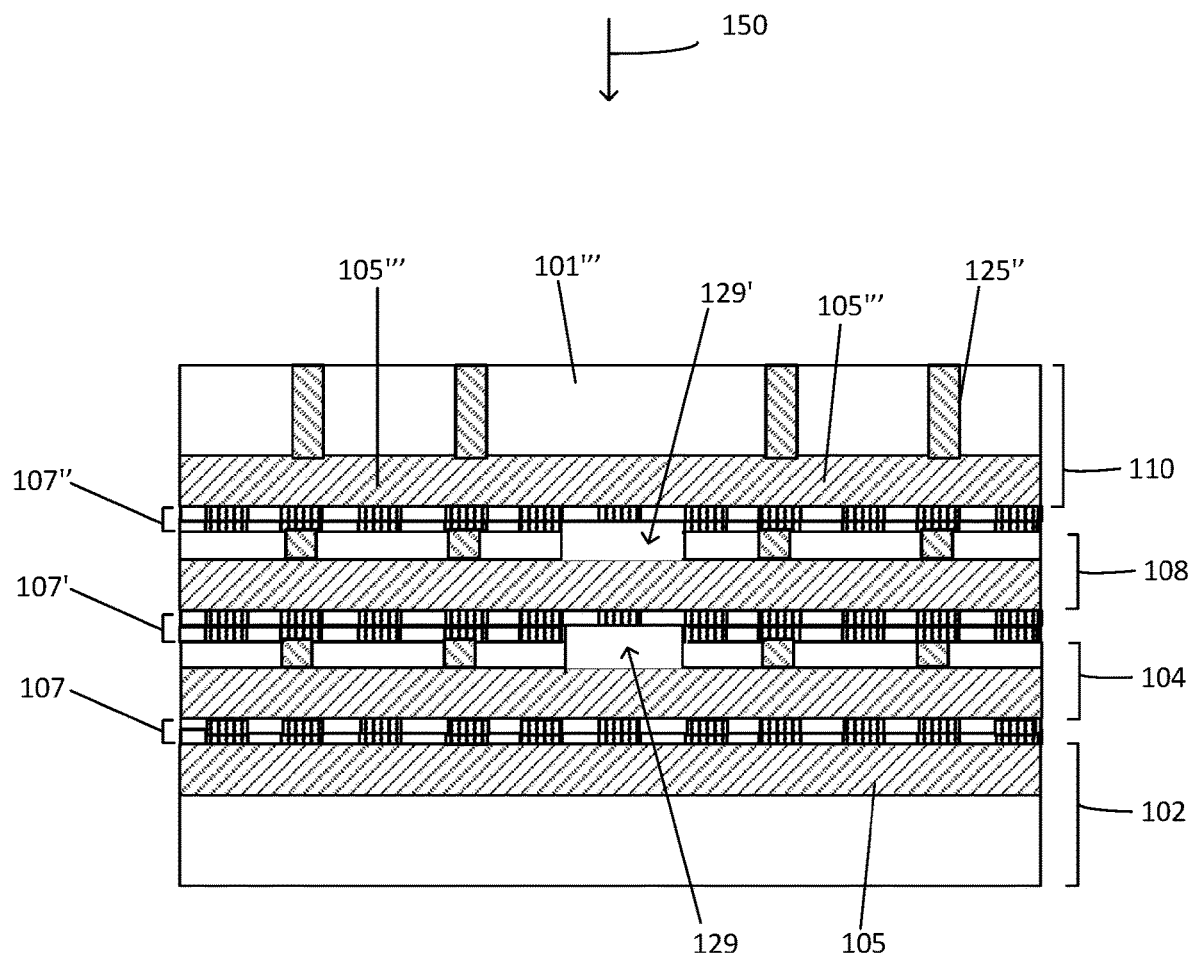
Figure 2J:
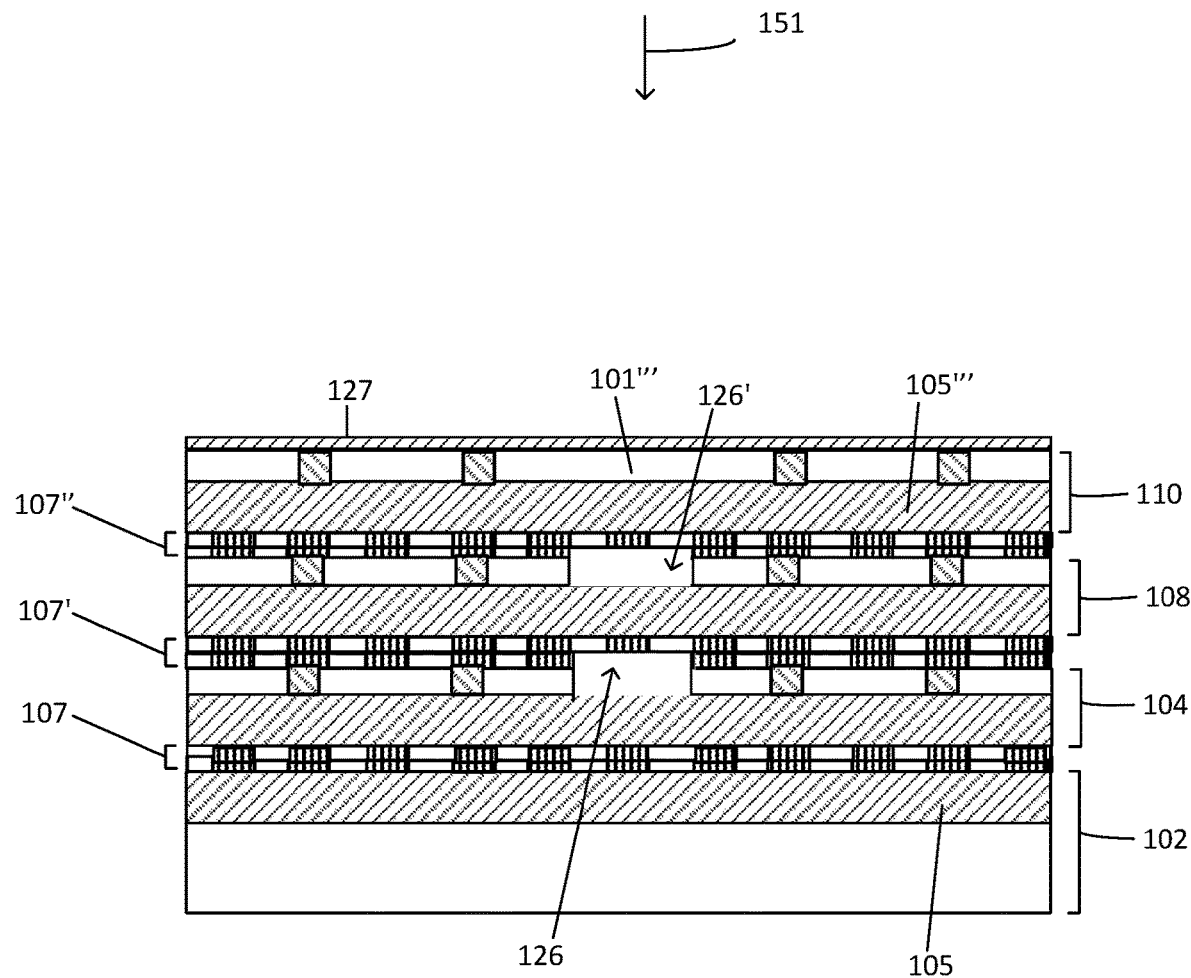
Figure 2K:
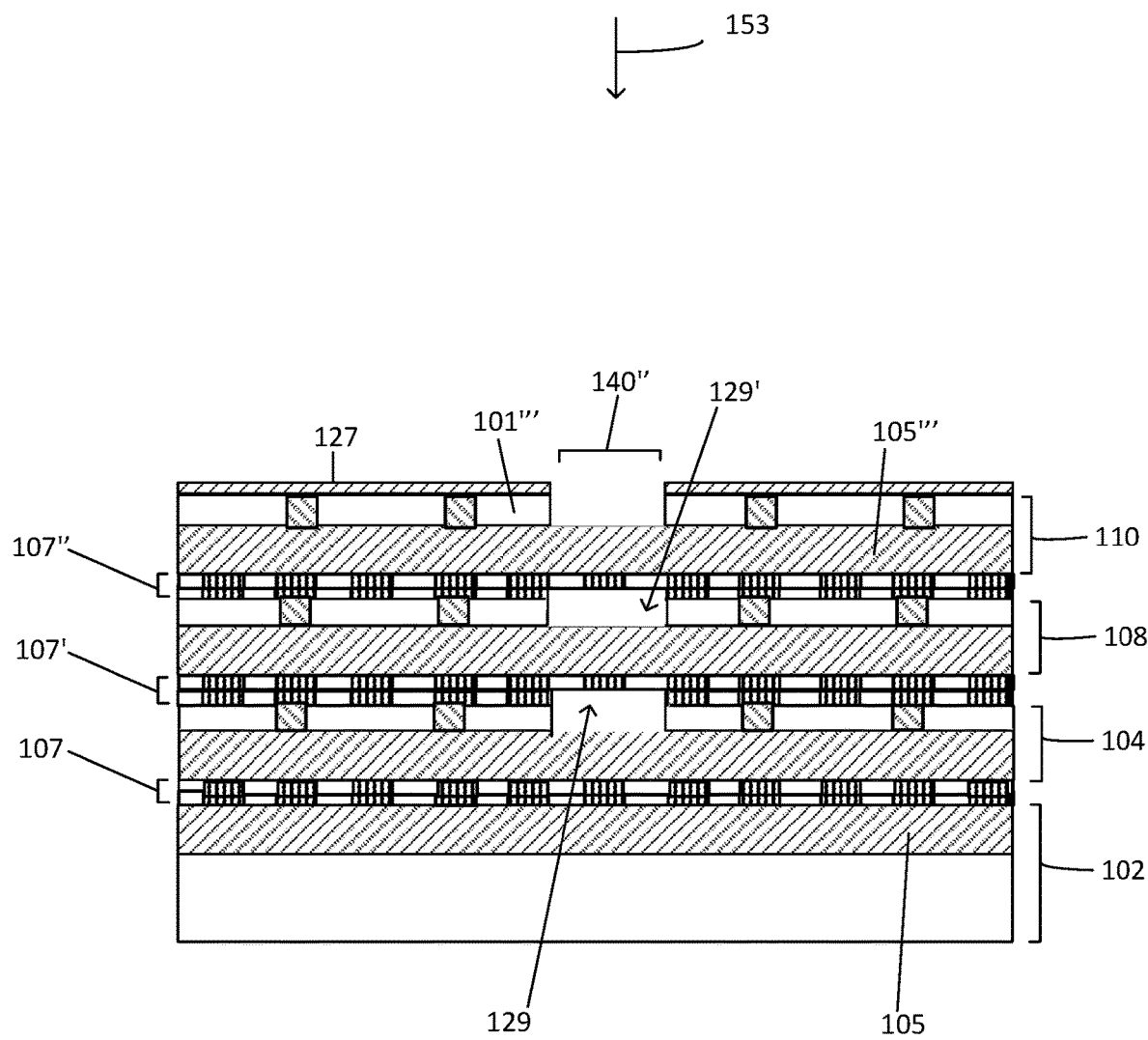
Figure 2L:
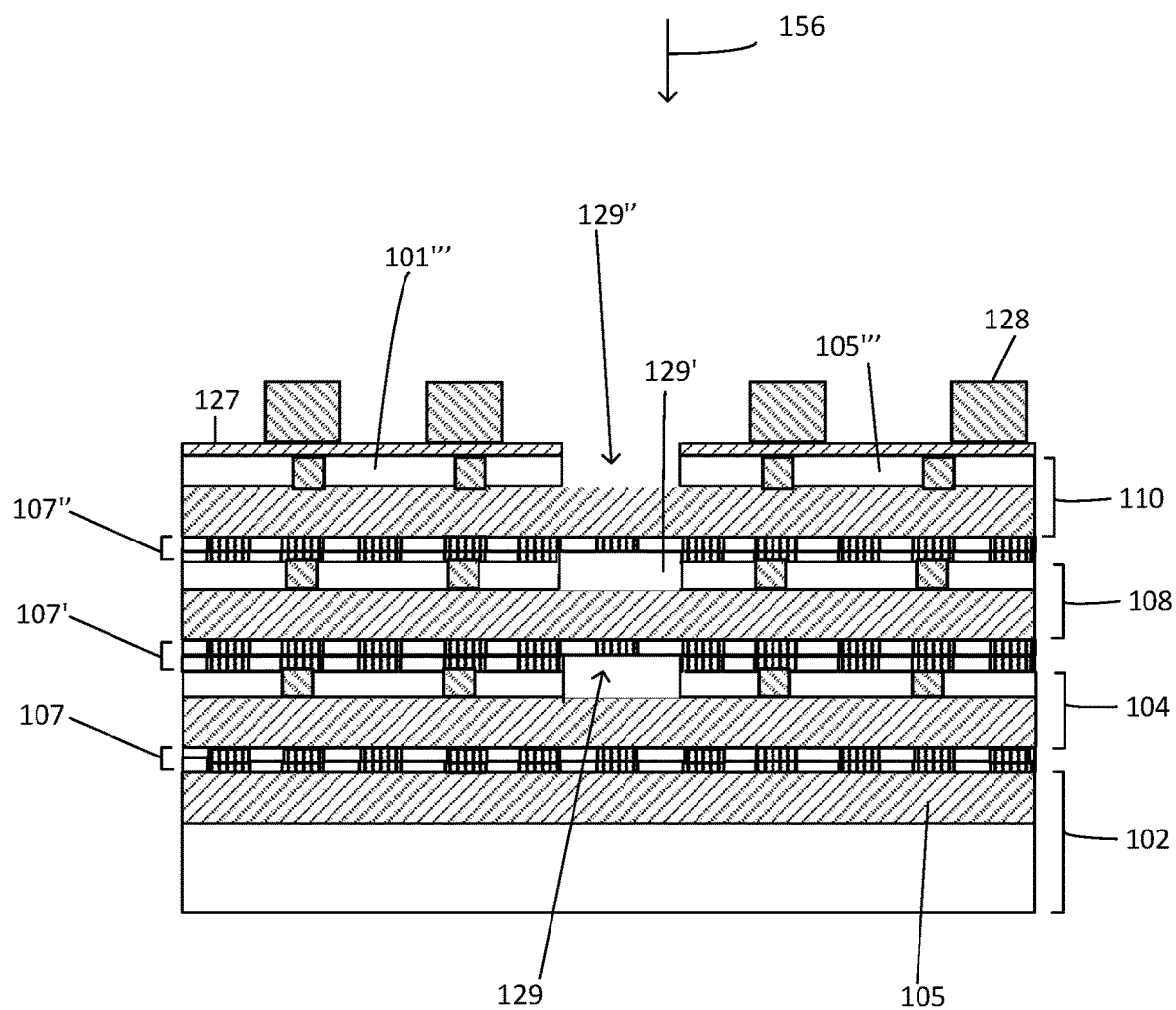
Figure 2M:
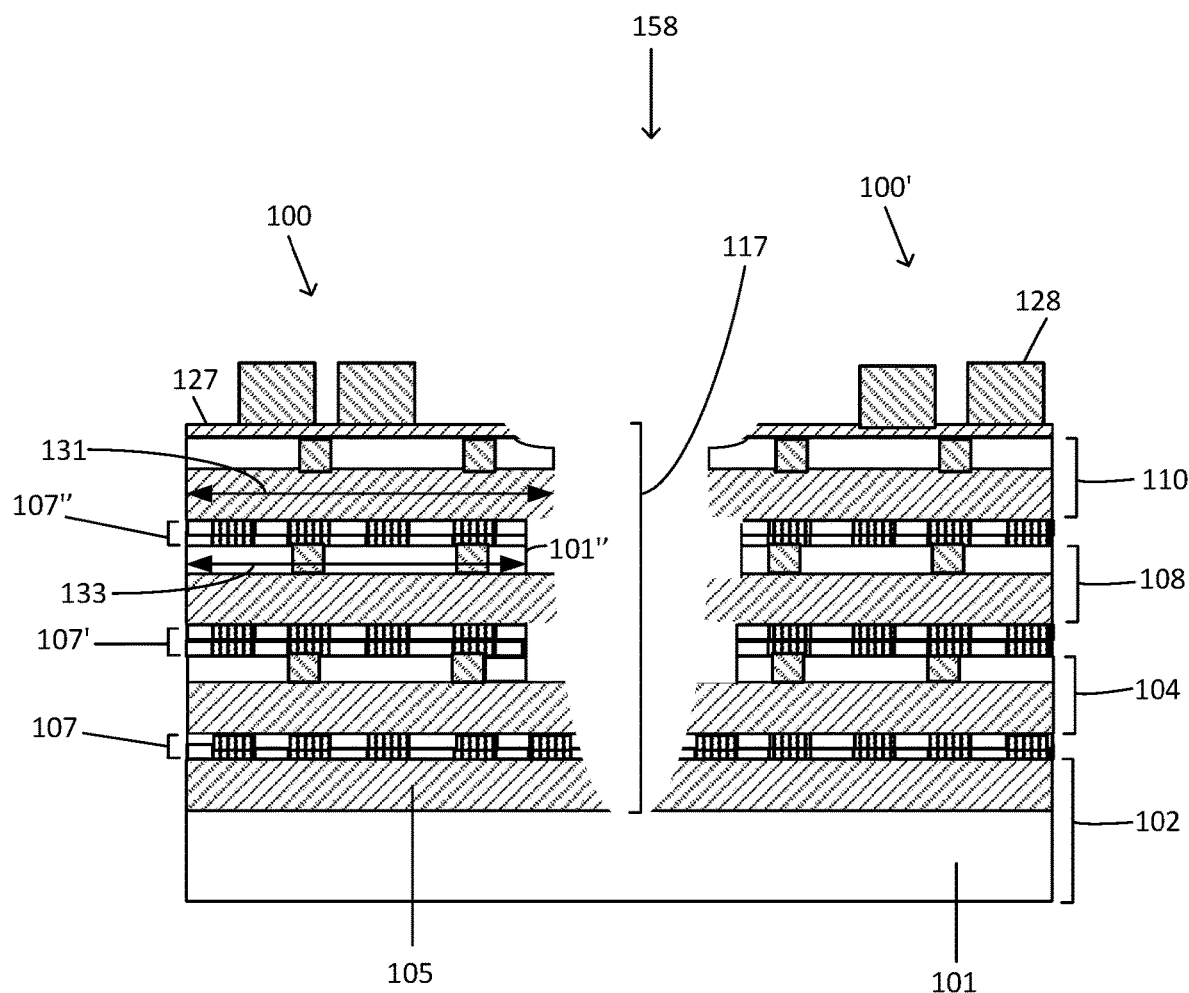
Figure 2N:
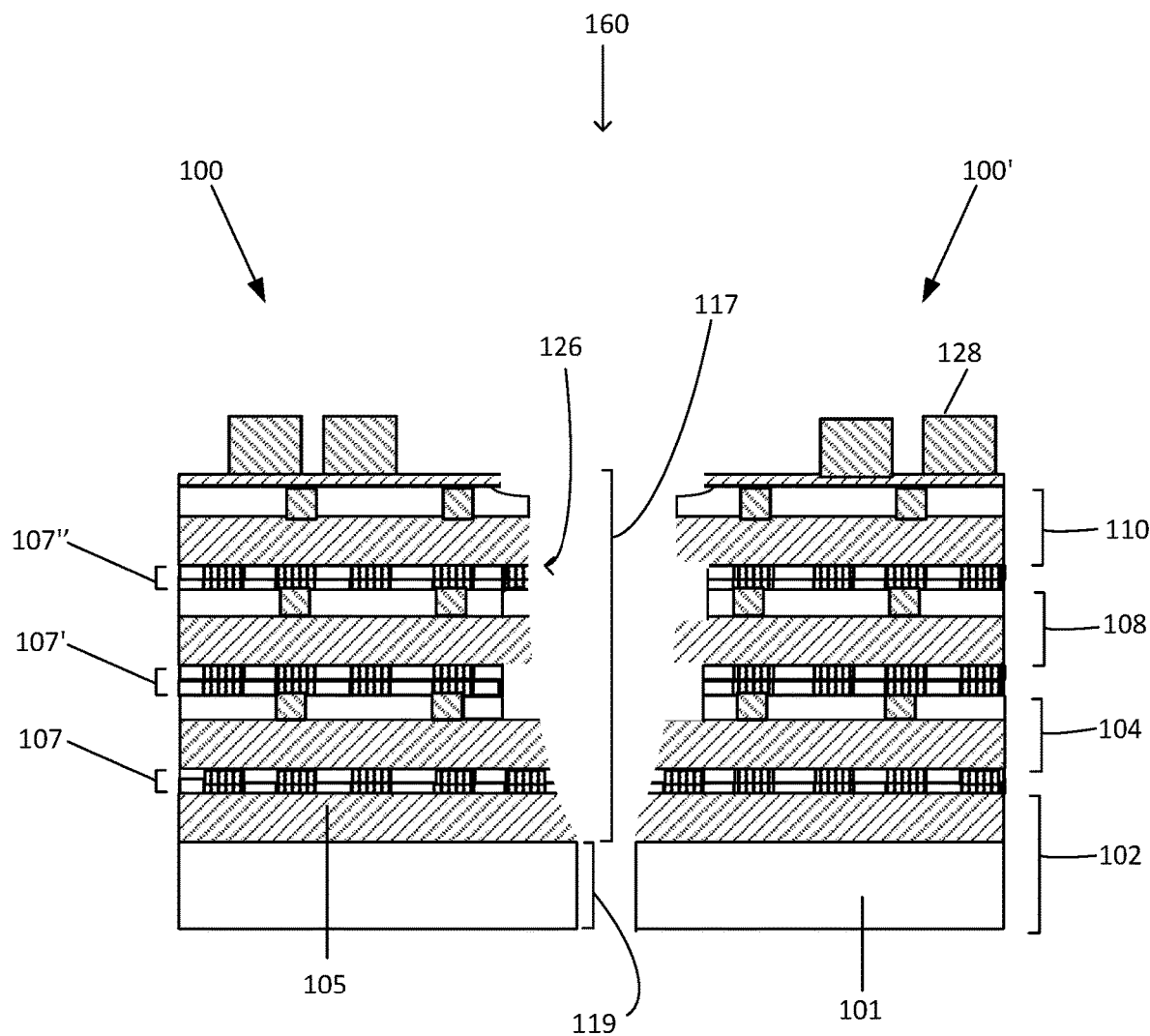

FIGS. 2A-2N depict the formation of stacked die package structures according to embodiments herein. FIG. 2A depicts a first substrate 102 that may be provided for assembly of a stacked die package structure. The first substrate 102 may comprise a first wafer 102 in some embodiments. The first substrate 102 may comprise any type of functionality, such as a graphics die, or a logic die, for example on a wafer substrate. An active region 105 is over a bulk silicon portion 101 of the first substrate 102. One or more conductive structures 113 may be over and electrically and physically coupled to the active region 105. The one or more conductive structures 113 may be separated by a dielectric material 115 and may comprise a first die bond layer 106. The one or more conductive structures 113 may comprise copper, in some embodiments, but may comprise any suitable conductive materials or alloys thereof. The dielectric material 115 may comprise silicon and oxygen, in some embodiments. In some embodiments, the die dielectric material 115 may comprise any suitable dielectric material.

A second substrate 104 may comprise any type of functionality, such as a graphics die, or a logic die, for example. An active region 105' is over a bulk silicon portion 101' of the first substrate 102. In an embodiment, the bulk silicon portion 101' of the second die 104 may comprise a first height 109. One or more conductive structures 113' may be over and electrically and physically coupled to the active region 105'. The one or more conductive structures 113' may be separated by a dielectric material 115' and may comprise a second die bond layer 106'. The one or more conductive structures 113' may comprise any appropriate conductive material, including but not limited to, metals, such as copper, silver, nickel, gold, aluminum, alloys thereof, and the like.

The dielectric material 115' may comprise silicon and oxygen, in some embodiments. In some embodiments, the second substrate 104 dielectric material 115' may comprise any suitable dielectric material. The second substrate 104 may comprise conductive vias 125 extending at least partially through the bulk silicon region 101' of the second die 104 and are coupled to the active region 105'. The conductive vias 125 may comprise through silicon vias, in some embodiments. The conductive vias 125 may comprise copper or any suitable conductive materials, in some embodiments.

The second substrate 104 and the first substrate 102 may be hybrid bonded to each other using a hybrid substrate attach process 150. The second substrate conductive structures 113' may be placed on the first die conductive structures 113. Also, second substrate dielectric material 115' may be placed on the first substrate dielectric material 115.

The attachment process 150, which may comprise a hybrid bonding process, first bonds the second die dielectric material 115' to the first substrate dielectric material 115 through the creation of van der Waals adhesion between the dielectric materials. In some embodiments, the first die and second die dielectric materials may comprise such dielectric materials as interlayer dielectric materials (ILDs) such as but not limited to dielectric materials comprising silicon and oxygen. Secondly, through high temperature fusion bonding between the first substrate 102 and second substrate 104 conductive structures 113, 113' metal bonding may occur at interface regions between the first die conductive structures 113 and the second die conductive structures 113'.

FIG. 2B depicts the first and second substrates 102, 104 subsequent to undergoing the attachment process 150 of FIG. 2A. A first hybrid bond layer 107 is formed between the first and second substrates 102, 104. Metal to metal bonds have been formed at interface regions/mating surfaces between the first die conductive structures 113 and the second die conductive structures 113'. Insulator to insulator bonds between the first die 102 dielectric material 115 and the second substrate 104 dielectric material 115' are formed at interface regions/mating surfaces through the creation of van der Waals bond formation.

FIG. 2C depicts a thinning process 151 wherein a portion of the bulk silicon layer 101' is removed from the second substrate 104, and a portion of the conductive via 125 is removed from the second substrate 104. The thinning process 151 may include any suitable grinding processes for example, such as any suitable silicon and/or metal etch grinding processes such as are known in the art. In some embodiments, the removal process 151 may additionally comprise a chemical mechanical polishing (CMP) process, for example. Subsequent to the removal process 151, the bulk silicon layer 101' may comprise a second height 118, and the conductive via 125 may comprise a height (is coplanar with) that is the same as the height 118 of the thinned bulk silicon layer 101'.

FIG. 2D depicts a bonding layer formation process 152 wherein a second bond layer 106" may be formed on the bulk silicon layer 101' of the second substrate 104. The bonding layer formation process 152 may comprise any suitable conductive material formation processes including such processes as atomic layer deposition (ALD), chemical vapor deposition (CVD) and the like. Any suitable dielectric formation processes such as CVD and the like may be utilized to form the second bond layer 106".

FIG. 2E depicts a removal process 153 wherein a portion of the second substrate 104 and a portion of the second bonding layer 106" may be removed in a region 140 of the second substrate 104. In some embodiments, the region 140 is in a central region of the second substrate 104. The removal process 153 reveals the underlying active region 105' of the second substrate 104. In an embodiment, any suitable dry and/or wet etching processes may be employed to remove the conductive and dielectric materials of the portion of the bonding layer 106" and the portion of the bulk silicon layer 105' from the region 140.

FIG. 2F depicts a third substrate 108 subsequent to undergoing a hybrid bonding attachment process 150 (as depicted in FIG. 2B, for example), wherein the third substrate 108 is hybrid bonded to the second substrate 104. A second hybrid bond layer 107' is formed between the second and third substrates 104, 108. The third substrate 108 comprises a bulk silicon layer 101", an active region 105" and conductive via structures 125'. A first opening 129 may be located between the second substrate 104 and the third substrate 108 in the region 140. The third substrate 108 is over the first opening 129.

In FIG. 2G a thinning process similar to the thinning process of FIG. 2C may be employed wherein a portion of the bulk silicon layer 101" and a portion of the conductive via 125' is removed from the third substrate 108. The thinning process 151 may include any suitable dry or wet etch processes for example. In some embodiments, the removal process 151 may comprise a chemical mechanical polishing (CMP) process, for example. Subsequent to the removal process 151, the bulk silicon layer 101" may comprise a thinned thickness. The conductive via 125' may comprise a height (is coplanar with) that is the same as the thickness of the thinned bulk silicon layer 101". A third bonding layer 106''' may be formed on the third substrate 108 utilizing a bonding process, such as the bonding process of FIG. 2D.

FIG. 2H depicts a removal process 153 wherein a portion of the third substrate 108 and a portion of the third bonding layer 106''' may be removed in the region 140' of the third substrate 108. In some embodiments, the region 140' is aligned with the region 140 of the second substrate 104. The removal process 153 reveals the underlying active region 105" of the third substrate 108. In an embodiment, any suitable dry and/or wet etching processes may be employed to remove the conductive and dielectric materials of the portion of the bonding layer 106''' and the portion of the bulk silicon layer 101" from the region 140'.

FIG. 2I depicts a fourth substrate 110 subsequent to undergoing a hybrid bonding attachment process 150 (as depicted in FIG. 2B, for example), wherein the fourth substrate 110 is hybrid bonded to the third substrate 108. A third hybrid bond layer 107" is formed between the third and fourth substrates 108, 110. The fourth substrate 110 comprises a bulk silicon layer 101''', an active region 105''' and conductive via structures 125". A second opening 129' may be located between the fourth substrate 110 and the third substrate 108 in the region 140'. The fourth substrate 110 is over the second and first openings 129', 129.

In FIG. 2J a thinning process similar to the thinning process of FIG. 2C may be employed wherein a portion of the bulk silicon layer 101''' and a portion of the conductive via 125" is removed from the fourth substrate 110. The thinning process 151 may include any suitable dry or wet etch processes for example. In some embodiments, the removal process 151 may comprise a chemical mechanical polishing (CMP) process, for example. Subsequent to the removal process 151, the bulk silicon layer 101''' may comprise a thinned thickness. The conductive via 125" may comprise a height (is coplanar with) that is the same as a height of the thinned bulk silicon layer 101'''. A redistribution layer (RDL) 127 may be formed on the fourth substrate 110.

FIG. 2K depicts a removal process 153 wherein a portion of the fourth substrate 110 and a portion of the RDL layer 127 may be removed in the region 140" of the fourth substrate 110. In some embodiments, the region 140" is aligned with the region 140' of the third substrate 108 and is aligned with the region 140 of the second substrate 104. The removal process 153 reveals the underlying active region 105''' of the fourth substrate 110. In an embodiment, any suitable dry and/or wet etching processes may be employed to remove the conductive and dielectric materials of the portion of the RDL layer 127 and the portion of the bulk silicon layer 105''' from the region 140".

FIG. 2L depicts a pad formation process 156 wherein conductive pads 128 are formed on the RDL layer 127. The conductive pads 127 may compose any suitable conductive material and alloys thereof, including copper, for example. The conductive pads 127 are available for conductively coupling the stacked die package structure 100 to any suitable interface, such as an interposer and/or system componentry. The openings 129, 129', 129" are vertically aligned with each other.

FIG. 2M depicts a laser scribe process 158 wherein portions of the fourth, third and second dies 110, 108, 104 and a portion of the active region 105 of the first die are removed from edge regions by a laser scribe. Any suitable laser scribe process may be utilized as is known to those skilled in the art. The portions of the fourth, third and second dies 110, 108, 104 and the portion of the active region 105 of the first die 102 are removed in the regions 140, 140', 140" as well as edge regions adjacent to openings 129, 129'129"'.

The edges of the fourth die 110, the third die 108, the second die 104 and the active region 105 of the first die 102, as well as edges of the hybrid bond layers 107, 107', 107" comprise a first portion 117 of an edge portion of a stacked die package structure 100, 100'. In some embodiments, the stacked die package structures 100, 100' may be formed by using a laser scribe process in combination with a saw process. In some embodiments, the first portion of the edge region comprises a substantially curved profile.

In some embodiments, the first portion 117 may comprise a substantially concave curvature profile. In some embodiments the first portion 117 may comprise a jagged first portion 117, wherein an active region 105'" of the fourth die 110 may comprise a greater lateral width 131 than a lateral width 133 of the bulk silicon layer 101" of the third die 108, for example due, to differences in removal rates of the active region 105'" of the fourth die 110 and the bulk silicon layer 101" of the third die 108 during the laser scribe process 158, for example. In some embodiments, the laser scribe process 158 does not remove any appreciable amount of the bulk silicon layer 101 of the first die 102.

FIG. 2N depicts a saw process 160, wherein a sawing process (as are known to those skilled in the art) may be employed to remove the bulk silicon layer 101 of the first die 102. The saw process may include a physical and/or chemical process, such as a physical saw process with a chemical Bosch process, as are known in the art. The saw process 160 completes a singulation process which forms the stacked die package structures 100, 100'. In some embodiments, a singulation process 170 (as depicted in FIG. 1A for example) comprises the laser scribe process 158 in combination with the saw process 160. A second portion 119 of the edge region 126 may comprise an edge of a bulk undoped silicon material in some embodiments. The second portion 119 of the edge region 126 may comprise a vertical profile through the bulk silicon layer 101 of the first die 102. The substantially vertical profile may arise from the sawing process through the bulk silicon layer 101. Embodiments of the various methods described herein enable increased speed for singulation processes, such when singulating scribe/street areas of wafers. and increasing throughput. The embodiments herein decrease the occurrence of cracking of dielectric layers during processing, thus improving yield.

Figure 3A:
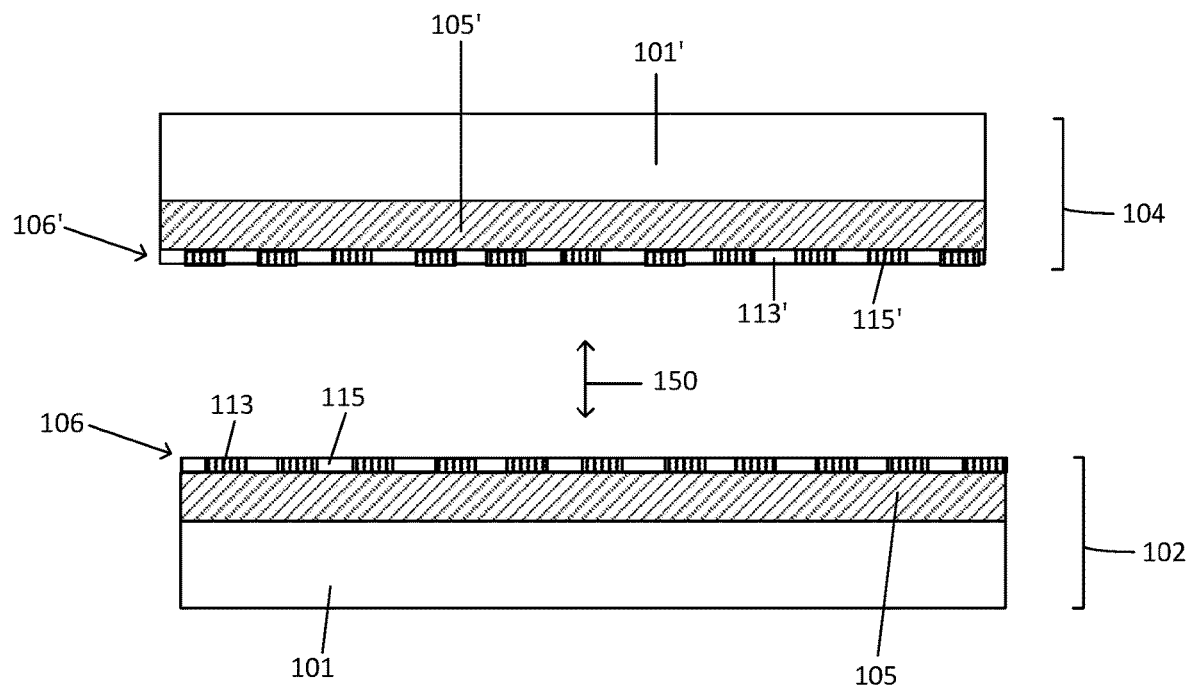
FIGS. 3A-3H illustrate cross-sectional views of forming stacked die assemblies comprising a moisture seal coating, in accordance with some embodiments.

FIGS. 3A-3F depict methods of forming a stacked die package structures according to some embodiments herein. FIG. 3A depicts a first substrate 102 that may be provided for assembly of a stacked die package structure. The first substrate 102 may comprise a first wafer 102 in some embodiments. The first substrate 102 may comprise any type of functionality, such as a graphics die, or a logic die, for example. An active region 105 is over a bulk silicon portion 101 of the first substrate 102. One or more conductive structures 113 may be over and electrically and physically coupled to the active region 105.

The one or more conductive structures 113 may be separated by a dielectric material 115 and may comprise a first die bond layer 106. The one or more conductive structures 113 may comprise copper, in some embodiments, but may comprise any suitable conductive materials or alloys thereof. The dielectric material 115 may comprise silicon and oxygen, in some embodiments. In some embodiments, the die dielectric material 115 may comprise any suitable dielectric material.

A second substrate 104 may comprise any type of functionality, such as a graphics die, or a logic die, for example. An active region 105' is on a bulk silicon portion 101' of the first substrate 102. One or more conductive structures 113' may be on and electrically and physically coupled to the active region 105'. The one or more conductive structures 113' may be separated by a dielectric material 115' and may comprise a die bond layer 106'. The one or more conductive structures 113' may comprise any appropriate conductive material, including but not limited to, metals, such as copper, silver, nickel, gold, aluminum, alloys thereof, and the like.

Figure 3B:
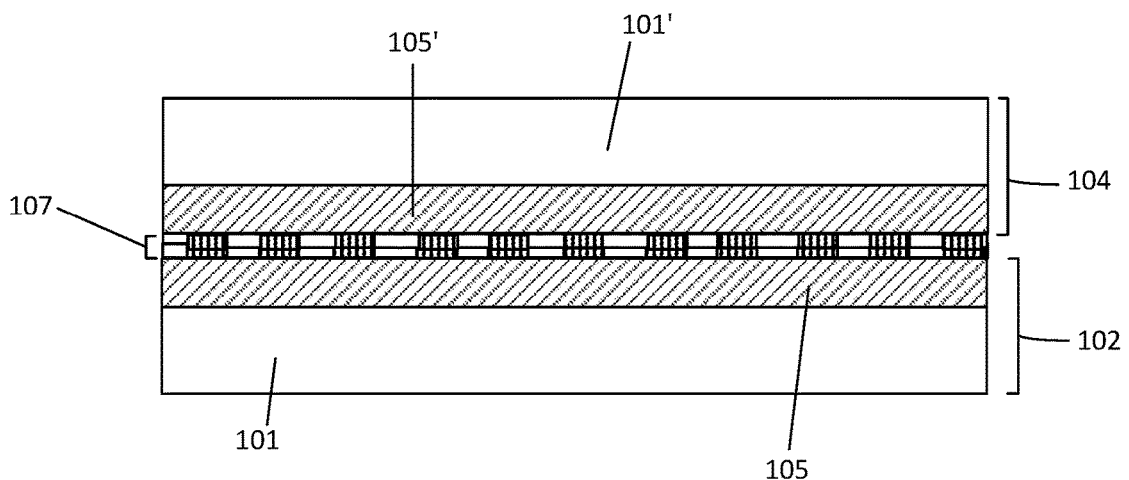

The second substrate 104 and the first substrate 102 may be hybrid bonded to each other using a hybrid substrate attach process 150. FIG. 3B depicts the first and second substrates 102, 104 subsequent to undergoing the attachment process 150 of FIG. 3A. A first hybrid bond layer 107 is formed between the first and second substrates 102, 104. Metal to metal bonds have been formed at interface regions/mating surfaces between the first substrate conductive structures 113 and the second substrate conductive structures 113'. Insulator to insulator bonds between the first substrate 102 dielectric material 115 and the second substrate 104 dielectric material 115' are formed at interface regions/mating surfaces through the creation of van der Waals bond formation.

Figure 3C:
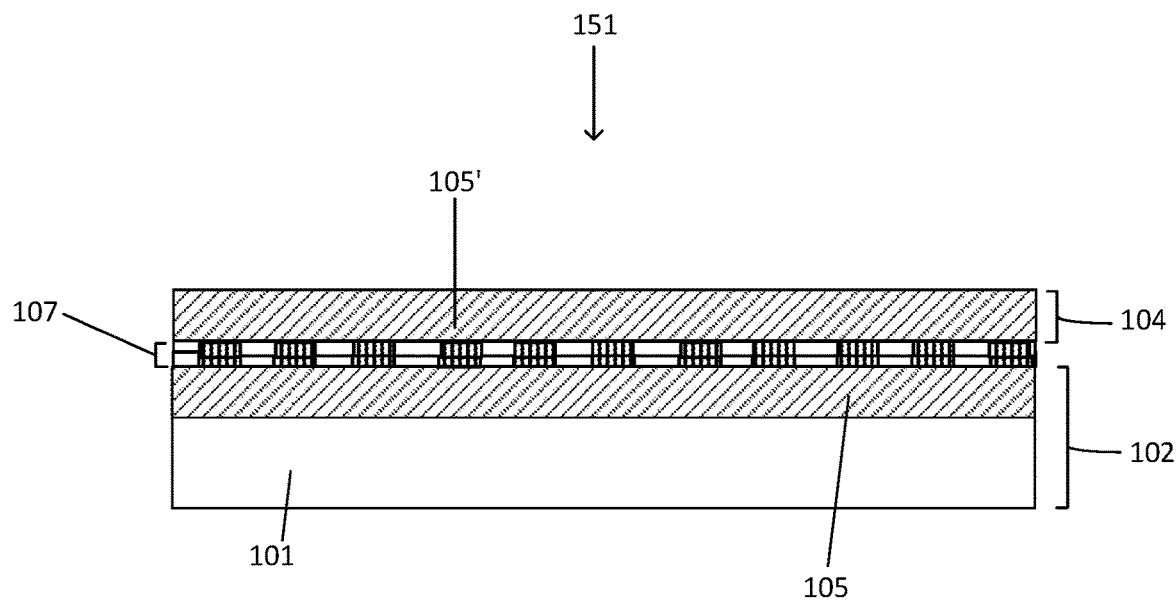

FIG. 3C depicts a thinning process 151 wherein all of the bulk silicon layer 101' is removed from the second substrate 104. The thinning process 151 may include any suitable dry or wet etch processes for example, such as any suitable silicon etch and/or metal etch chemistries as are known in the art. In some embodiments, the removal process 151 may comprise a chemical mechanical polishing (CMP) process, for example.

Figure 3D:
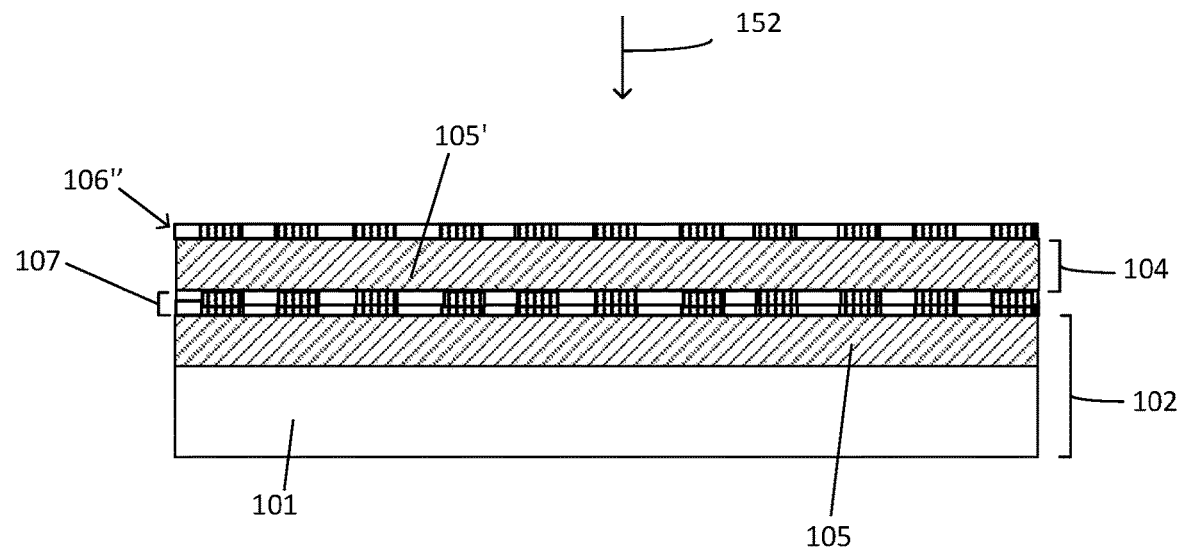

FIG. 3D depicts a bonding layer formation process 152 wherein a second bond layer 106" may be formed on the active region 105' of the second substrate 104. The bonding layer formation process 152 may comprise any suitable conductive material formation processes including such processes as atomic layer deposition (ALD), chemical vapor deposition (CVD) and the like. Any suitable dielectric formation processes such as CVD and the like may be utilized to form the second bond layer 106".

Figure 3E:
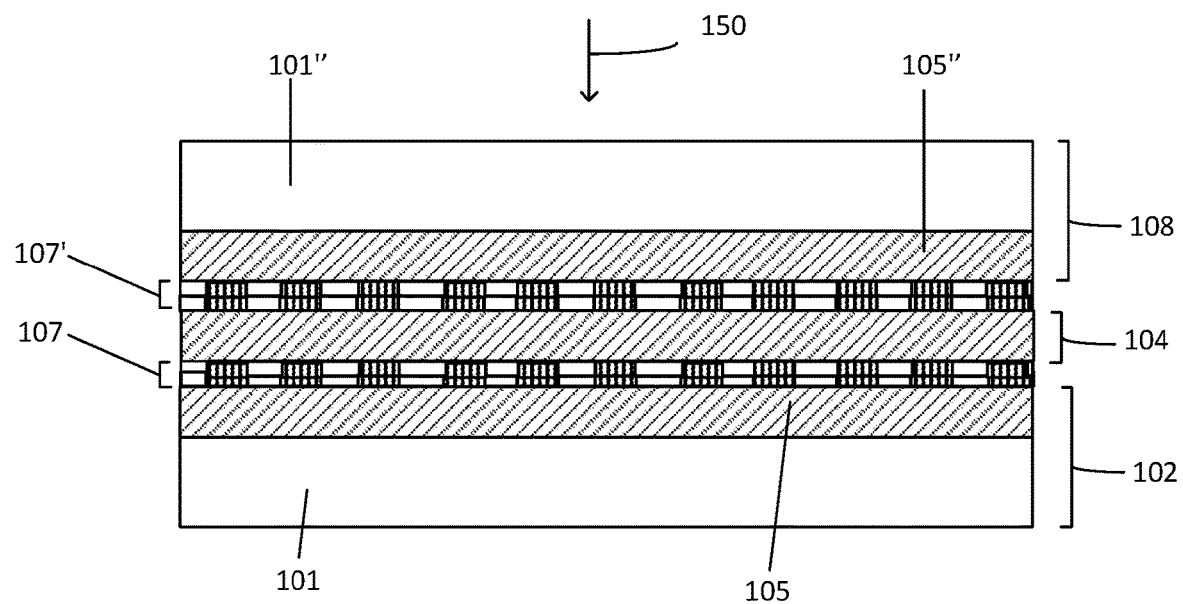

FIG. 3E depicts a third substrate 108 subsequent to undergoing a hybrid bonding attachment process 150 (as depicted in FIG. 3B, for example), wherein the third substrate 108 is hybrid bonded to the second substrate 104. A second hybrid bond layer 107' is formed between the second and third substrates 104, 108. The third substrate 108 comprises a bulk silicon layer 101" and an active region 105".

Figure 3F:
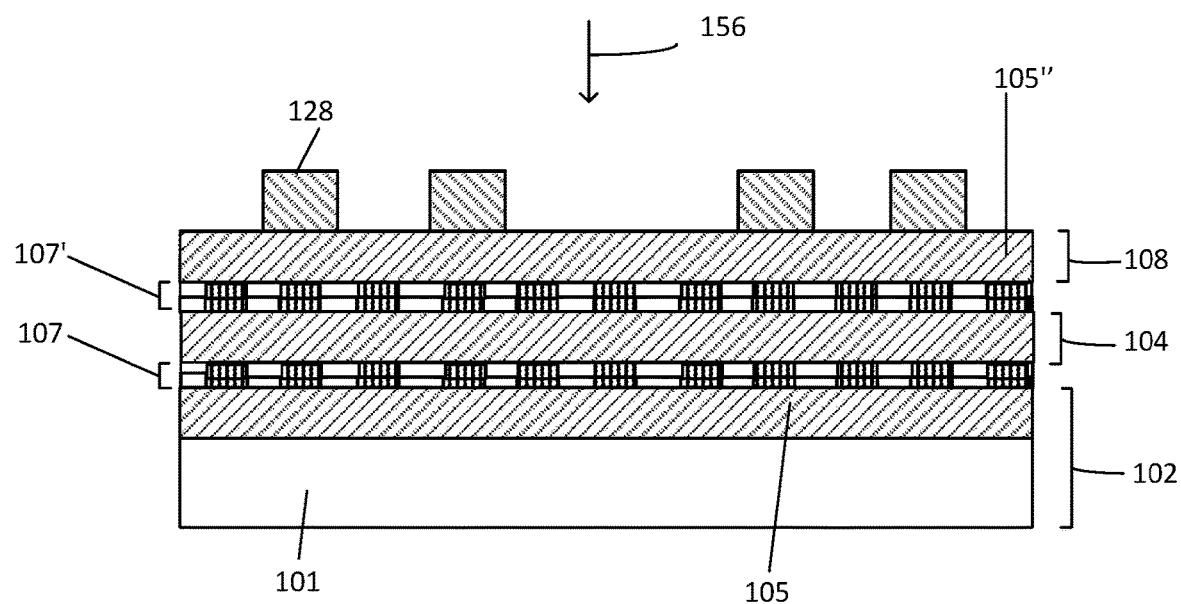
Figure 3G:
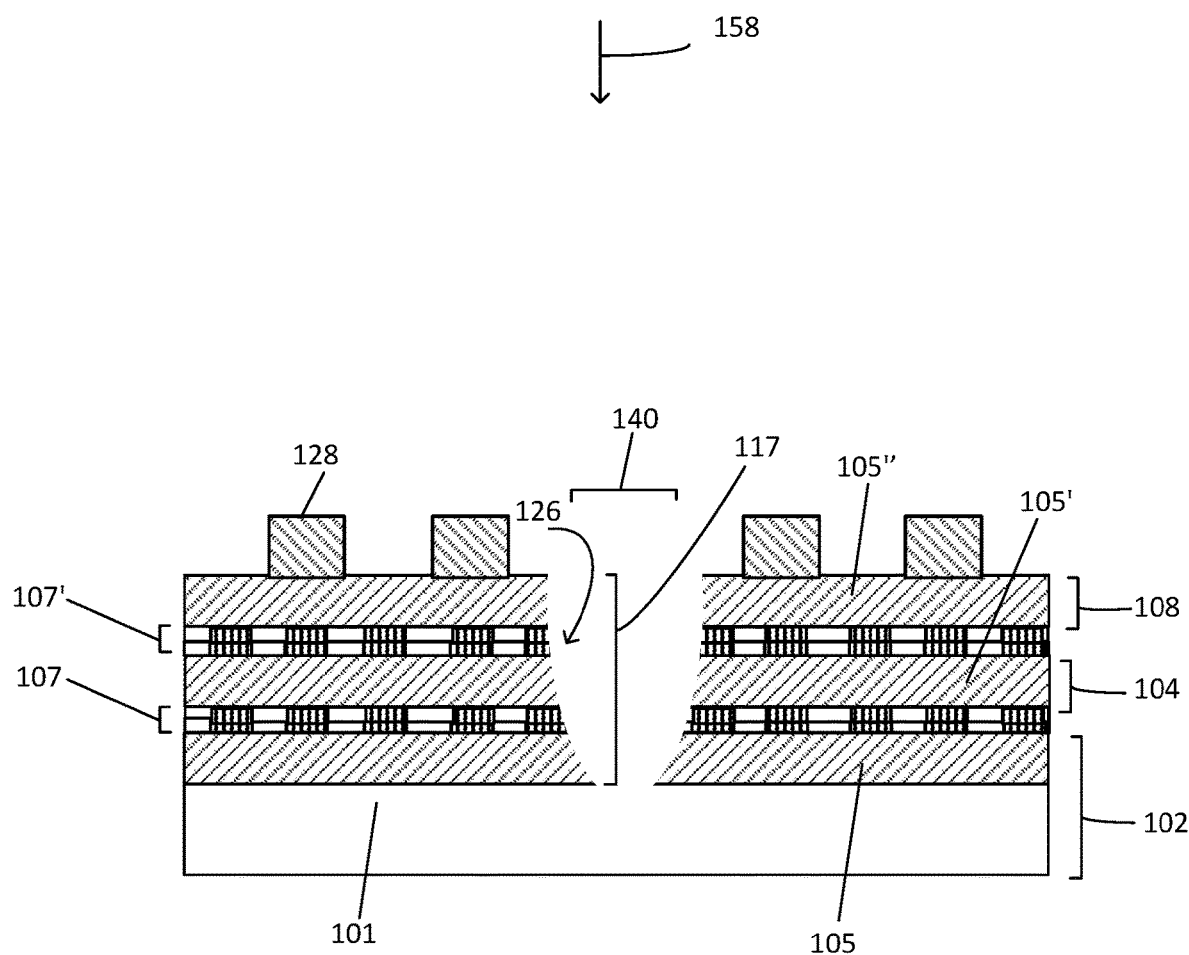

In FIG. 3F a thinning process similar to the thinning process of FIG. 3C may be employed (not shown) wherein all of the bulk silicon layer 101" is removed from the third substrate 108. A pad formation process 156 may be utilized to form conductive pads 128 on the third die 108. In FIG. 3G a laser scribe process 158 (such as laser process 158 of FIG. 2M, for example) may be utilized to form an edge region 126. The laser scribe process 158 may be performed in a region 140 and may form a first portion 117 of an edge region 126 of a stacked die package structure 100, 100'. The first portion 117 comprises a substantially curved profile. In some embodiments, the laser scribe process 158 does not remove any appreciable amount of the bulk silicon layer 101 of the first die 102.

Figure 3H:
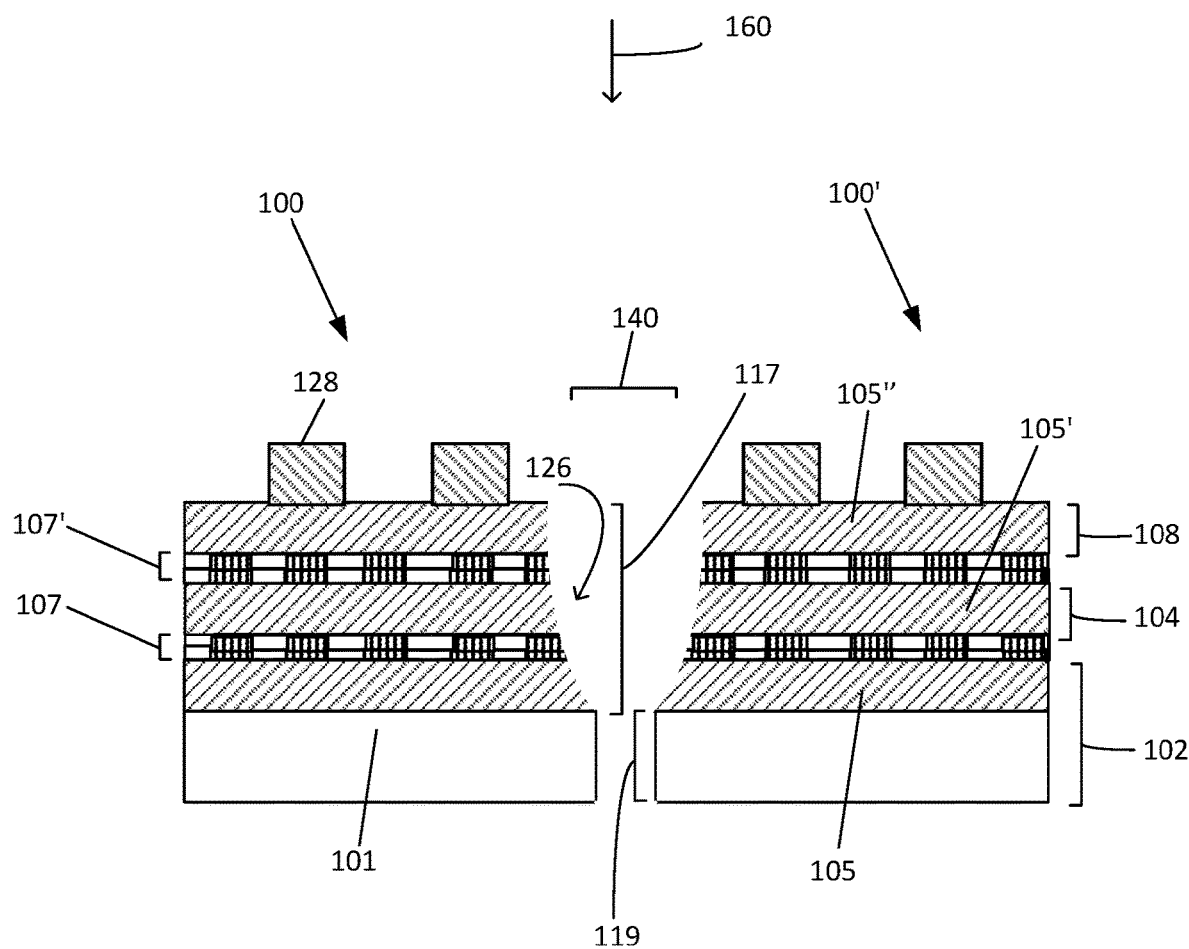

The first portion 117 comprises edges of the third die 108, the second die 104, and the active region 105 of the first die 102, as well as edges of the hybrid bond layers 107, 107'. In FIG. 3H a saw process 160 may be utilized to form a second portion 119 of the edge region 126 of the stacked die package structures 100, 100'. The second portion 119 comprises the edge of the bulk silicon layer 101 of the first die 102, which may comprise an edge of a substrate layer 101 of the first die 102 in some embodiments. The second portion 119 comprises a substantially vertical profile. In some embodiments, the substantially curved profile may comprise a substantially concave curvature profile and may comprise a smooth first portion 117. The second portion 119 may comprise bulk undoped silicon in some embodiments. The second portion 119 of the edge region 126 may comprise a vertical profile through the entire bulk silicon layer 101 of the first die 102.

Figure 4A:
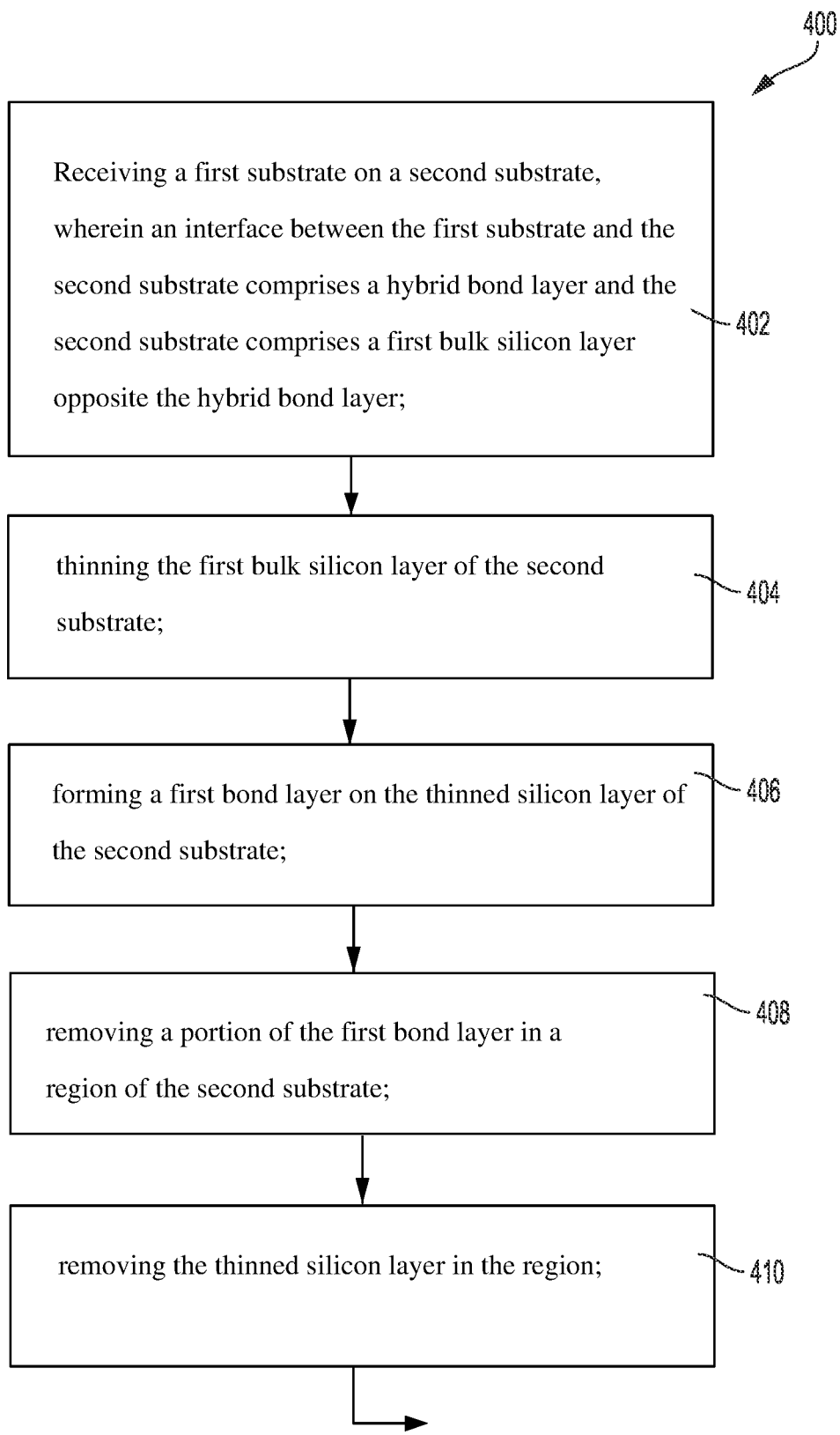
FIG. 4A-4B illustrates a flow chart of a process that includes forming stacked die assemblies comprising a moisture seal coating, in accordance with some embodiments.

FIG. 4A is a flow chart of a process 400 of fabricating a stacked die package structure according to some embodiments. As set forth in block 402, a first substrate on a second substrate is received, wherein an interface between the first substrate and the second substrate comprises a hybrid bond layer and the second substrate comprises a first bulk silicon layer opposite the hybrid bond layer. As set forth in block 404, the first bulk silicon layer of the second substrate is thinned. A first bond layer is formed on the thinned silicon layer of the second substrate as set forth in block 406. A portion of the first bond layer is removed in a region of the second substrate as set forth in block 408. At block 410 the thinned silicon layer in the region may be removed.

Figure 4B:
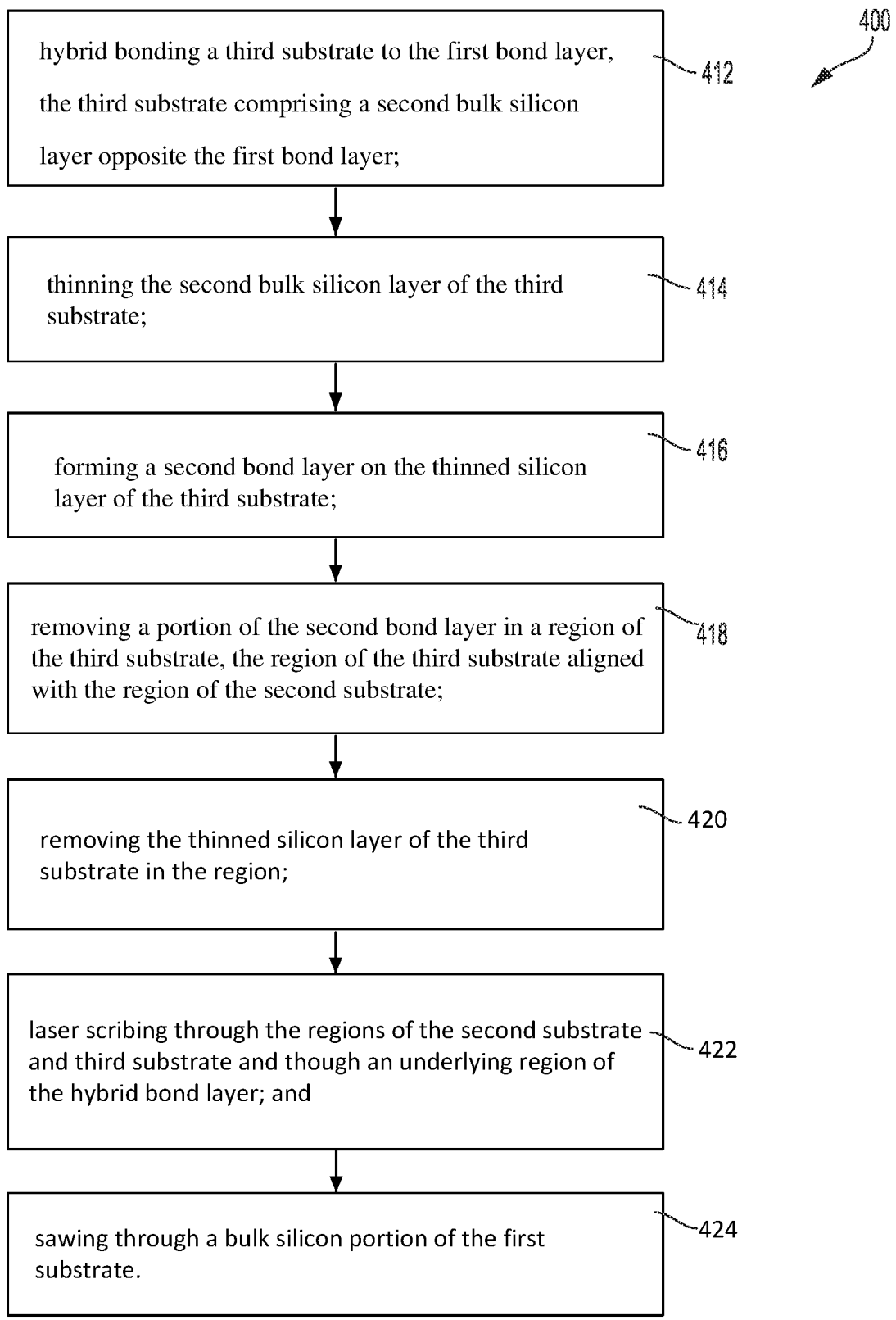

FIG. 4B is a continuation of the flow chart of process 400. At block 412 a third substrate is hybrid bonding to the first bond layer, the third substrate comprising a second bulk silicon layer opposite the first bond layer. At block 414 the second bulk silicon layer of the third substrate may be thinned. As set forth in block 416, a second bond layer may be formed on the thinned silicon layer of the third substrate. A portion of the second bond layer may be removed in a region of the third substrate, wherein the region of the third substrate is aligned with the region of the second substrate as set forth in block 418. The thinned silicon layer of the third substrate in the region may be removed as set forth in block 420. The regions of the second substrate, third substrate and the underlying region of the hybrid bond layer may be laser scribed through as set forth in block 422, and as set forth in block 424, a bulk silicon portion of the first substrate may be sawed through.

Figure 5A:
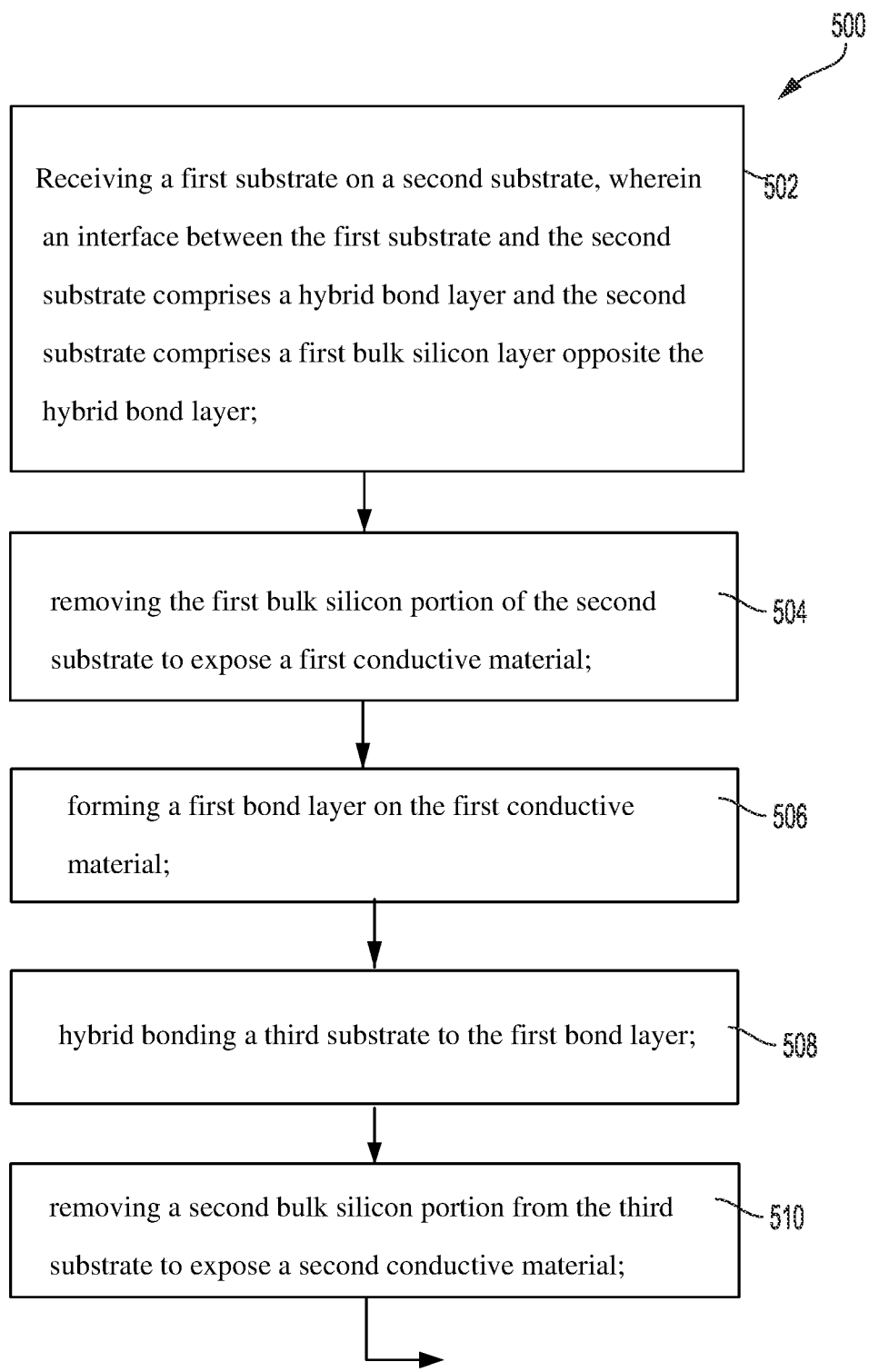
FIG. 5A-5B illustrates a flow chart of a process that includes forming stacked die assemblies comprising a moisture seal coating, in accordance with some embodiments.

FIG. 5A is a flow chart of a process 500 of fabricating a stacked die package structure according to some embodiments. A first substrate on a second substrate is received, wherein an interface between the first substrate and the second substrate comprises a hybrid bond layer and the second substrate comprises a first bulk silicon layer opposite the hybrid bond layer, as set forth in block 502. The first bulk silicon portion of the second substrate may be removed to expose a first conductive material, as set forth in block 504.

Figure 5B:
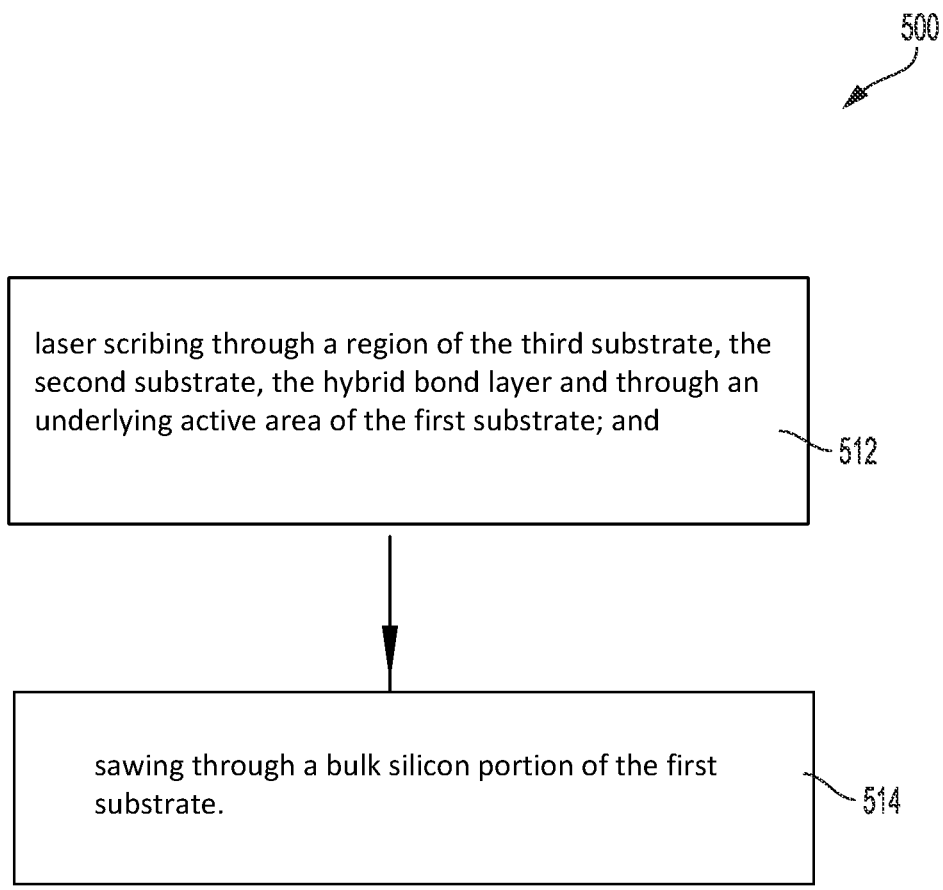

As set forth in block 506, a first bond layer may be formed on the first conductive material. As set forth in block 508, a third substrate may be hybrid bonded to the first bond layer. As set forth in block 510 a second bulk silicon portion may be removed from the third substrate to expose a second conductive material. FIG. 5B is a continuation of the flow chart of process 500. A region of the third substrate, the second substrate, the hybrid bond layer and an underlying active area of the first substrate may be laser scribing through as set forth in block 512. At block 514 a bulk silicon portion of the first substrate may be sawed through.

Figure 6:
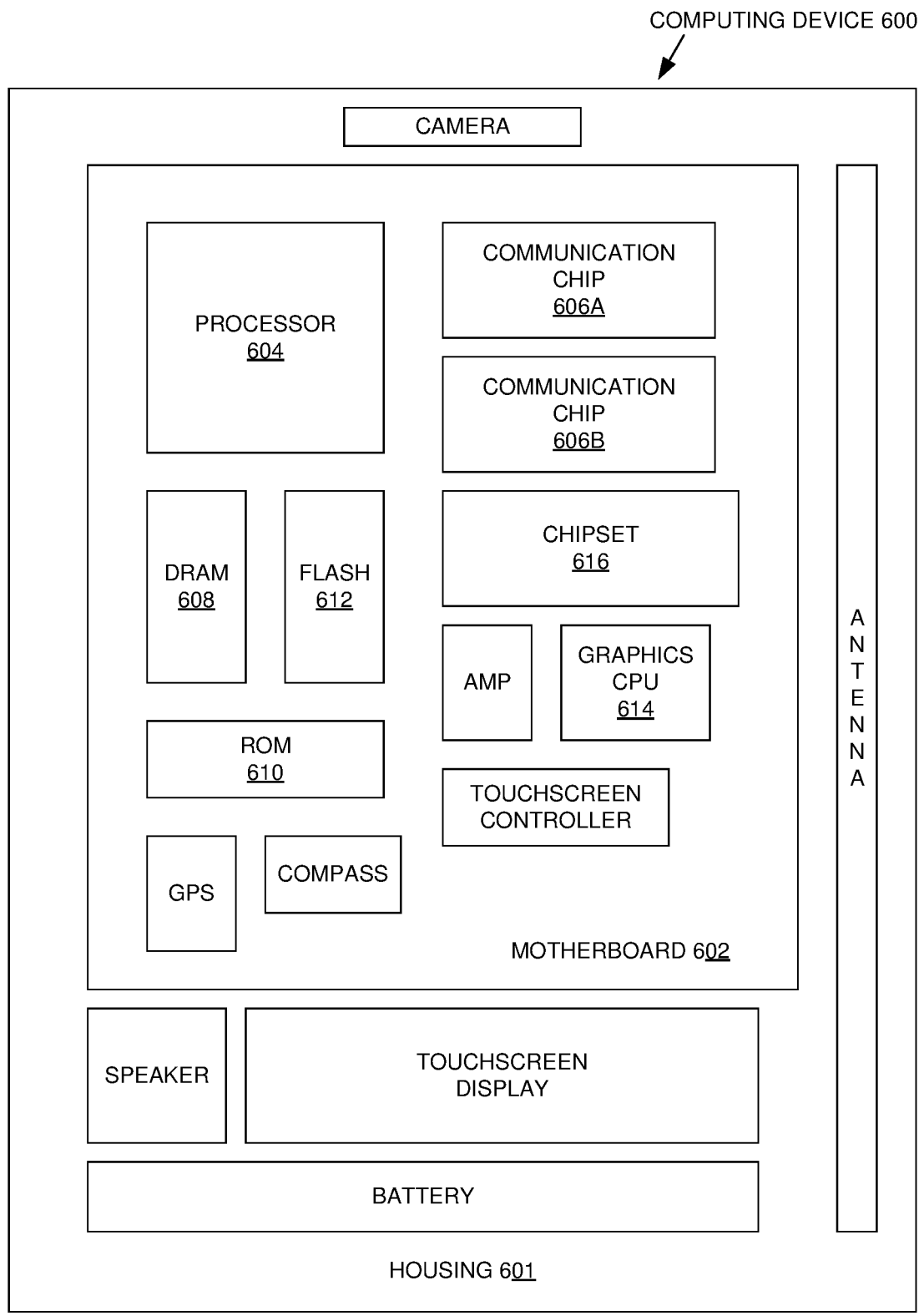
FIG. 6 is a functional block diagram of an electronic computing device, in accordance with some embodiments.

FIG. 6 illustrates an electronic or computing device 600 in accordance with one implementation of the present description. The computing device 600 may include a housing 601 having a board 602 disposed therein. The computing device 600 may include a number of integrated circuit components, including but not limited to a processor 604, at least one communication chip 606A, 606B, volatile memory 608 (e.g., DRAM), non-volatile memory 610 (e.g., ROM), flash memory 612, a graphics processor or CPU 614, a digital signal processor (not shown), a crypto processor (not shown), a chipset 616, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 602. In some implementations, at least one of the integrated circuit components may be a part of the processor 604.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an electronic substrate having a first die comprising a first conductive layer over a substrate layer, a second die comprising a first side and a second side, wherein the first side comprises a second conductive layer on the first conductive layer, and a third die comprising a third conductive layer on the second side of the second die, wherein an edge region of the microelectronic stacked die package structure comprises a first portion over a second portion. The first portion comprises edges of the third die, the second die, and the first conductive layer, and the second portion comprising the substrate layer of the first die. The first portion comprises a curved profile, and the second portion comprises a substantially vertical profile.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It is understood that the subject matter of the present description is not necessarily limited to specific applications illustrated in FIGS. 1-6. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein a first example is a first die comprising a first conductive layer over a substrate layer, a second die comprising a first side and a second side, wherein the first side comprises a second conductive layer on the first conductive layer, and a third die comprising a third conductive layer is on the second side of the second die, wherein an edge region of the microelectronic stacked die package structure comprises a first portion over a second portion, the first portion comprising edges of the third die, the second die, and the first conductive layer, and the second portion comprising the substrate layer of the first die, wherein the first portion comprises a curved profile, and the second portion comprises a substantially vertical profile.

In second examples, the first example can optionally include wherein the substrate layer comprises bulk silicon, wherein the first portion of the edge region is above the bulk silicon and comprises a concave profile.

In third examples, for any of the first examples the second portion comprises bulk silicon.

In fourth examples, for any of the first examples wherein the second conductive layer on the first conductive layer comprises a hybrid bond layer.

In fifth examples, wherein the fourth example can optionally include wherein a lateral width of the hybrid bond layer is greater than a lateral width of the second side of the second die.

In sixth examples, for any of the first examples wherein a hybrid bond layer is on the second side of the second die, wherein the third conductive layer is over the hybrid bond layer.

In seventh examples, wherein the fourth example can optionally include wherein a fourth die is on the third die, wherein a lateral width of an active region of the fourth die is greater than a lateral width of the hybrid bond layer.

In eighth examples, for any of the first examples wherein conductive bond pads are over the fourth die the microelectronic package structure.

In ninth examples, for any of the first examples wherein the second die and the third die do not comprise a bulk silicon portion.

In tenth examples, for any of the first examples wherein a lateral width of the third conductive layer is greater than a lateral width of the second side of the second die.

In eleventh examples a power supply is coupled to one or more integrated circuit packages, wherein at least one of the integrated circuit packages further comprises a first die comprising a first conductive layer over a substrate layer, a second die comprising a first side and a second side, wherein the first side comprises a second conductive layer, wherein the second conductive layer is on the first conductive layer, and a third die comprising a third conductive layer on the second side of the second die, wherein an edge region of the microelectronic stacked die package structure comprises a first portion over a second portion, the first portion comprising edges of the third die, the second die, and the first conductive layer, and the second portion comprising the substrate layer of the first die, wherein the first portion comprises a curved profile, and the second portion comprises a substantially vertical profile.

In twelfth examples, for any of the eleventh examples wherein the first conductive layer comprises one or more first conductive structures, wherein the second conductive layer comprises one or more second conductive structures, wherein the first conductive structures on the second conductive structures comprise a hybrid bond layer.

In thirteenth examples, for any of the eleventh examples wherein the substrate layer of the first die comprises a first side of a stacked die package structure, and wherein conductive pad structures are on a second side opposite of the first side of the stacked die structure.

In fourteenth examples, for any of the eleventh examples wherein the first portion of the edge region comprises a substantially smooth curved profile.

In fifteenth examples, for any of the eleventh examples wherein the first portion of the edge region comprises a jagged curved profile.

In sixteenth examples, receiving a first substrate on a second substrate, wherein an interface between the first substrate and the second substrate comprises a hybrid bond layer and the second substrate comprises a first bulk silicon layer opposite the hybrid bond layer;
  thinning the first bulk silicon layer of the second substrate; forming a first bond layer on the thinned silicon layer of the second substrate; removing a portion of the first bond layer in a region of the second substrate; removing the thinned silicon layer in the region; hybrid bonding a third substrate to the first bond layer, the third substrate comprising a second bulk silicon layer opposite the first bond layer; thinning the second bulk silicon layer of the third substrate; forming a second bond layer on the thinned silicon layer of the third substrate;
  removing a portion of the second bond layer in a region of the third substrate, the region of the third substrate aligned with the region of the second substrate; removing the thinned silicon layer of the third substrate in the region; laser scribing through the regions of the second substrate and third substrate and though an underlying region of the hybrid bond layer; and sawing through a bulk silicon portion of the first substrate.

In seventeenth examples, for any of the sixteenth examples wherein sawing through the bulk silicon portion of the first substrate comprises singulating a first wafer.

In eighteenth examples, for any of the sixteenth examples wherein laser scribing comprises removing dielectric material by using a dry etch process or a wet etch process.

In nineteenth examples for any of the sixteenth examples wherein sawing comprises plasma etching.

In twentieth examples for any of the sixteenth examples further comprising forming conductive pads on the second bond layer adjacent to the region of the third substrate.

In twenty first examples A method of fabricating a microelectronic package structure, the method comprising: receiving a first substrate on a second substrate, wherein an interface between the first substrate and the second substrate comprises a hybrid bond layer and the second substrate comprises a first bulk silicon layer opposite the hybrid bond layer; removing the first bulk silicon portion of the second substrate to expose a first conductive material; forming a first bond layer on the first conductive material; hybrid bonding a third substrate to the first bond layer; removing a second bulk silicon portion from the third substrate to expose a second conductive material; laser scribing through a region of the third substrate, the second substrate, the hybrid bond layer and through an underlying active area of the first substrate; and sawing through a bulk silicon portion of the first substrate.

In twenty second examples for any of the twenty first examples wherein laser scribing comprises forming a first portion of an edge region of the stacked die package structure, wherein the first portion comprises a curved edge profile.

In twenty third examples for any of the twenty first examples wherein sawing comprises forming a vertical profile in an edge region of the bulk silicon portion first substrate.

It will be recognized that principles of the disclosure are not limited to the embodiments so described but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A microelectronic stacked die package structure comprising:
   a first die comprising a first conductive layer over a substrate layer;
   a second die comprising a first side and a second side, wherein the first side comprises a second conductive layer on the first conductive layer; and
   a third die comprising a third conductive layer on the second side of the second die, wherein an edge region of the microelectronic stacked die package structure comprises a first portion over a second portion, the first portion comprising edges of the third die, the second die, and the first conductive layer, and the second portion comprising the substrate layer of the first die, wherein the first portion comprises a curved profile, and the second portion comprises a substantially vertical profile.

2. The microelectronic package structure of claim 1, wherein the substrate layer comprises bulk silicon, wherein the first portion of the edge region is above the bulk silicon and comprises a concave profile.

3. The microelectronic package structure of claim 1, wherein the second portion comprises bulk silicon.

4. The microelectronic package structure of claim 3, wherein the second conductive layer on the first conductive layer comprises a first hybrid bond layer.

5. The microelectronic package structure of claim 4 wherein a lateral width of the hybrid bond layer is greater than a lateral width of the second side of the second die.

6. The microelectronic package structure of claim 1 wherein a hybrid bond layer is on the second side of the second die, wherein the third conductive layer is over the hybrid bond layer.

7. The microelectronic package structure of claim 4 wherein a fourth die is on the third die, wherein a lateral width of an active region of the fourth die is greater than a lateral width of the first hybrid bond layer.

8. The microelectronic package structure of claim 7 wherein conductive bond pads are over the fourth die.

9. The microelectronic package structure of claim 1 wherein the second die and the third die do not comprise a bulk silicon portion.

10. The microelectronic package structure of claim 1 wherein a lateral width of the third conductive layer is greater than a lateral width of the second side of the second die.

11. A computer system comprising:
    a power supply;
    one or more integrated circuit packages coupled to the power supply, wherein at least one of the integrated circuit packages further comprises:
    a first die comprising a first conductive layer over a substrate layer;
    a second die comprising a first side and a second side, wherein the first side comprises a second conductive layer, wherein the second conductive layer is on the first conductive layer; and
    a third die comprising a third conductive layer on the second side of the second die, wherein an edge region of the microelectronic stacked die package structure comprises a first portion over a second portion, the first portion comprising edges of the third die, the second die, and the first conductive layer, and the second portion comprising the substrate layer of the first die, wherein the first portion comprises a curved profile, and the second portion comprises a substantially vertical profile.

12. The computer system of claim 11, wherein the first conductive layer comprises one or more first conductive structures, wherein the second conductive layer comprises one or more second conductive structures, wherein the first conductive structures on the second conductive structures comprise a hybrid bond layer.

13. The computer system of claim 11 wherein the substrate layer of the first die comprises a first side of a stacked die package structure, and wherein conductive pad structures are on a second side opposite of the first side of the stacked die structure.

14. The computer system of claim 11 wherein the first portion of the edge region comprises a substantially smooth curved profile.

15. The computer system of claim 11 wherein the first portion of the edge region comprises a jagged curved profile.

16. A method of fabricating a microelectronic package structure, the method comprising:
    receiving a first substrate on a second substrate, wherein an interface between the first substrate and the second substrate comprises a hybrid bond layer and the second substrate comprises a first bulk silicon layer opposite the hybrid bond layer;
    thinning the first bulk silicon layer of the second substrate;
    forming a first bond layer on the thinned silicon layer of the second substrate;
    removing a portion of the first bond layer in a region of the second substrate;

removing the thinned silicon layer in the region;
hybrid bonding a third substrate to the first bond layer, the third substrate comprising a second bulk silicon layer opposite the first bond layer;
thinning the second bulk silicon layer of the third substrate;
forming a second bond layer on the thinned silicon layer of the third substrate;
   removing a portion of the second bond layer in a region of the third substrate, the region of the third substrate aligned with the region of the second substrate;
removing the thinned silicon layer of the third substrate in the region;
laser scribing through the regions of the second substrate and third substrate and though an underlying region of the hybrid bond layer; and
sawing through a bulk silicon portion of the first substrate.

17. The method of claim 16 wherein sawing through the bulk silicon portion of the first substrate comprises singulating the first microelectronic package structure.

18. The method of claim 16 wherein laser scribing comprises removing dielectric material by using a laser.

19. The method of claim 16 wherein sawing comprises utilizing a chemical etch process.

20. The method of claim 16 further comprising forming conductive pads over the second bond layer adjacent to the region of the third substrate.

\* \* \* \* \*